US009875438B1

(12) United States Patent
Diorio et al.

(10) Patent No.: US 9,875,438 B1
(45) Date of Patent: Jan. 23, 2018

(54) RFID INTEGRATED CIRCUITS WITH ANTENNA CONTACTS ON MULTIPLE SURFACES

(71) Applicant: Impinj, Inc., Seattle, WA (US)

(72) Inventors: Christopher J. Diorio, Seattle, WA (US); Ronald L. Koepp, Seattle, WA (US); Harley K. Heinrich, Seattle, WA (US); Theron Stanford, Seattle, WA (US); Ronald A. Oliver, Seattle, WA (US); Shailendra Srinivas, Seattle, WA (US)

(73) Assignee: IMPINJ, INC., Seattle, WA (US)

( * ) Notice: Subject to any disclaimer, the term of this patent is extended or adjusted under 35 U.S.C. 154(b) by 0 days.

(21) Appl. No.: 15/015,452

(22) Filed: Feb. 4, 2016

Related U.S. Application Data

(63) Continuation of application No. 14/714,249, filed on May 16, 2015, now abandoned, which is a continuation of application No. 13/904,536, filed on Aug. 23, 2013, now Pat. No. 9,053,400, which is a continuation of application No. 13/820,473, filed as application No. PCT/US2012/054531 on Sep. 10, 2012, now abandoned.

(60) Provisional application No. 61/681,305, filed on Aug. 9, 2012, provisional application No. 61/623,016, filed on Apr. 11, 2012.

(51) Int. Cl.
*G06K 19/07* (2006.01)
*G06K 19/077* (2006.01)

(52) U.S. Cl.
CPC ... *G06K 19/0723* (2013.01); *G06K 19/07745* (2013.01)

(58) Field of Classification Search
CPC ......... G06K 19/0723; G06K 19/07745; G06K 19/07; G06K 19/0701; G06K 19/077; G06K 19/0772; G06K 19/07747; G06K 19/07749; G06K 19/0775; G06K 19/07754; G06K 19/07756; G06K 19/07766; G06K 19/07767; G06K 19/07773; G06K 19/07775; H01Q 1/2208; H01Q 1/2225; H01Q 1/2283; H01L 23/49855
See application file for complete search history.

(56) References Cited

U.S. PATENT DOCUMENTS

| | | | |
|---|---|---|---|
| 6,147,605 | A | 11/2000 | Vega et al. |
| 6,407,669 | B1 | 6/2002 | Brown et al. |
| 6,693,541 | B2 | 2/2004 | Egbert |
| 7,298,343 | B2 | 11/2007 | Forster et al. |

(Continued)

OTHER PUBLICATIONS

Non-Final Office Action received in U.S. Appl. No. 13/820,473 dated Aug. 5, 2015 and filed Aug. 23, 2013.

(Continued)

*Primary Examiner* — Scott B Geyer
(74) *Attorney, Agent, or Firm* — Turk IP Law, LLC

(57) ABSTRACT

Embodiments are directed to a Radio Frequency Identification (RFID) integrated circuit (IC) having a first circuit block electrically coupled to first and second antenna contacts. The first antenna contact is disposed on a first surface of the IC and the second antenna contact is disposed on a second surface of the IC different from the first surface. The first and second antenna contacts are electrically disconnected from each other.

14 Claims, 30 Drawing Sheets

(56) References Cited

U.S. PATENT DOCUMENTS

| | | | |
|---|---|---|---|
| 7,503,491 B2 * | 3/2009 | Zhu | G06K 19/07749 235/451 |
| 7,675,464 B2 | 3/2010 | Cleeves | |
| 7,768,405 B2 | 8/2010 | Yamazaki et al. | |
| 7,828,221 B2 * | 11/2010 | Kwon, II | G06K 19/07749 235/451 |
| 8,350,768 B2 * | 1/2013 | Peters | G06K 19/06009 343/730 |
| 8,628,018 B2 | 1/2014 | Zenz et al. | |
| 9,053,400 B2 * | 6/2015 | Diorio | G06K 19/0723 |
| 2003/0006936 A1 | 1/2003 | Aoyama et al. | |
| 2006/0290514 A1 | 12/2006 | Sakama et al. | |
| 2007/0095926 A1 * | 5/2007 | Zhu | G06K 19/07749 235/492 |
| 2008/0258916 A1 | 10/2008 | Diorio et al. | |
| 2008/0277484 A1 * | 11/2008 | Launay | G06K 19/07749 235/492 |
| 2009/0027208 A1 * | 1/2009 | Martin | G06K 7/10178 340/572.5 |
| 2009/0145971 A1 | 6/2009 | Yin | |
| 2009/0231139 A1 * | 9/2009 | Heurtier | G06K 19/0724 340/572.7 |
| 2010/0001079 A1 * | 1/2010 | Martin | G06K 19/07749 235/492 |
| 2010/0038433 A1 | 2/2010 | Ikemoto | |
| 2010/0224685 A1 | 9/2010 | Aoki | |
| 2010/0253583 A1 | 10/2010 | Furutani | |
| 2010/0302038 A1 | 12/2010 | Brommer et al. | |
| 2010/0308968 A1 | 12/2010 | Tamm et al. | |
| 2011/0011939 A1 | 1/2011 | Seah | |
| 2011/0090058 A1 * | 4/2011 | Ikemoto | H01Q 5/35 340/10.1 |
| 2011/0148737 A1 | 6/2011 | Kang | |
| 2011/0242779 A1 | 10/2011 | Grasset | |
| 2011/0293969 A1 | 12/2011 | Hoofman et al. | |
| 2012/0019363 A1 | 1/2012 | Fein | |
| 2012/0049937 A1 | 3/2012 | Waffaoui | |
| 2012/0080527 A1 | 4/2012 | Finn | |

OTHER PUBLICATIONS

Final Office Action received for U.S. Appl. No. 13/820,473 dated Jun. 5, 2015 and filed Aug. 23, 2013.
Final Office Action received for U.S. Appl. No. 13/904,395 dated Jun. 2, 2015 and filed Aug. 23, 2013.
Non Final Office Action for U.S. Appl. No. 13/904,395, dated Dec. 5, 2014 and filed Aug. 23, 2013.
Non Final Office Action for U.S. Appl. No. 13/904,479 dated Dec. 10, 2014 filed Aug. 23, 2013.
International Search Report and Written Opinion issued in application PCT/US2012/054531, filed Sep. 10, 2012, dated Nov. 27, 2012.
Non Final Office Action for U.S. Appl. No. 13/820,473, dated Dec. 17, 2014 and filed Aug. 23, 2013.
International Preliminary Report on Patentability for PCT/US2012/054531 filed Sep. 10, 2012, dated Oct. 23, 2014, dated Oct. 14, 2014.

* cited by examiner

SIGNAL PATH DURING R→T

SIGNAL PATH DURING T→R

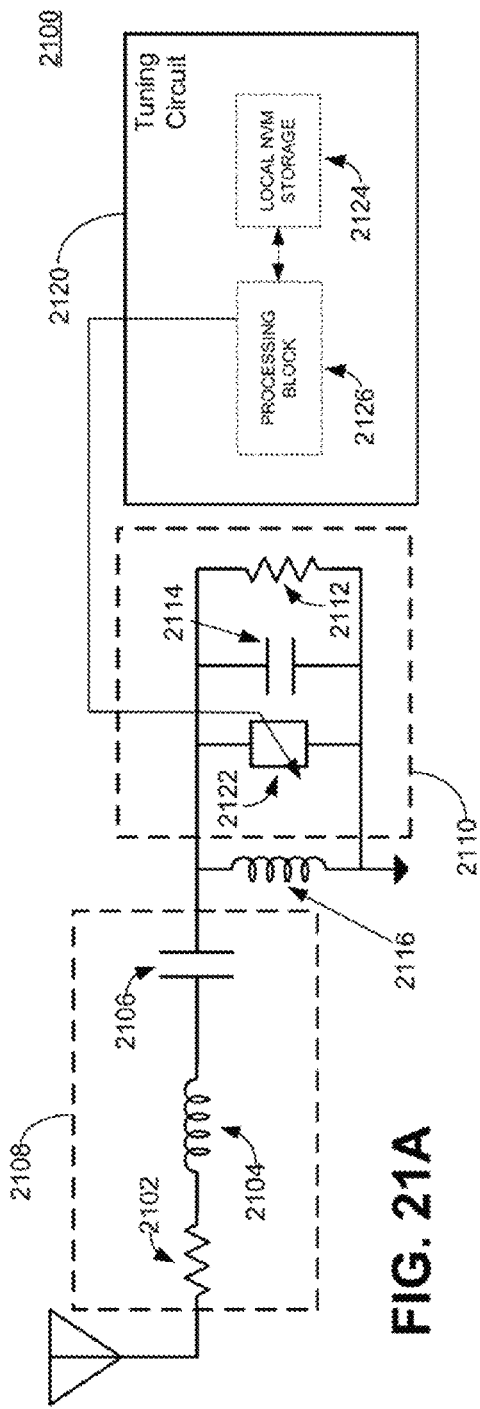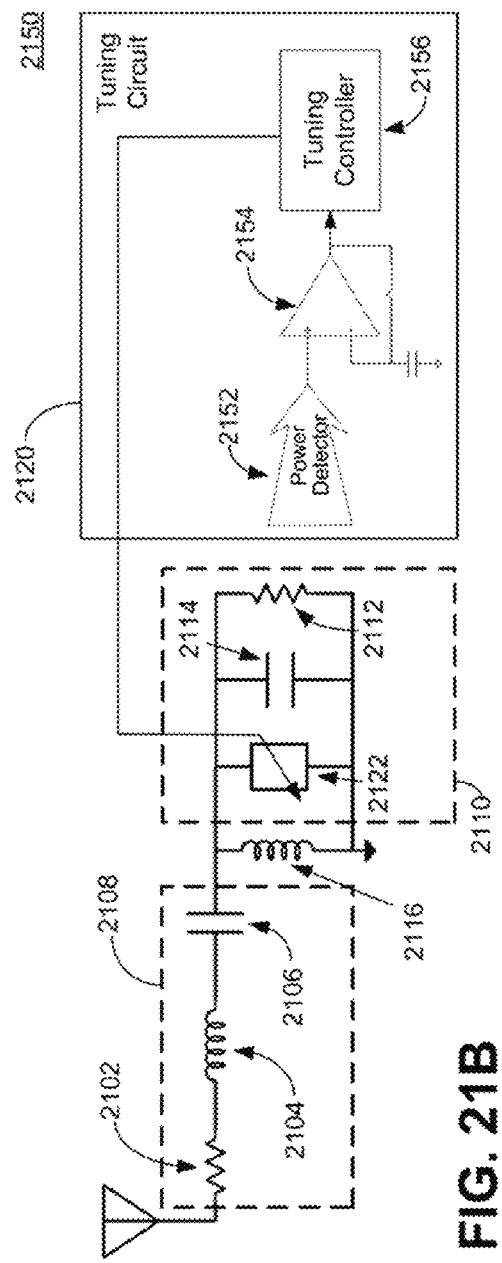
FIG. 21A
FIG. 21B

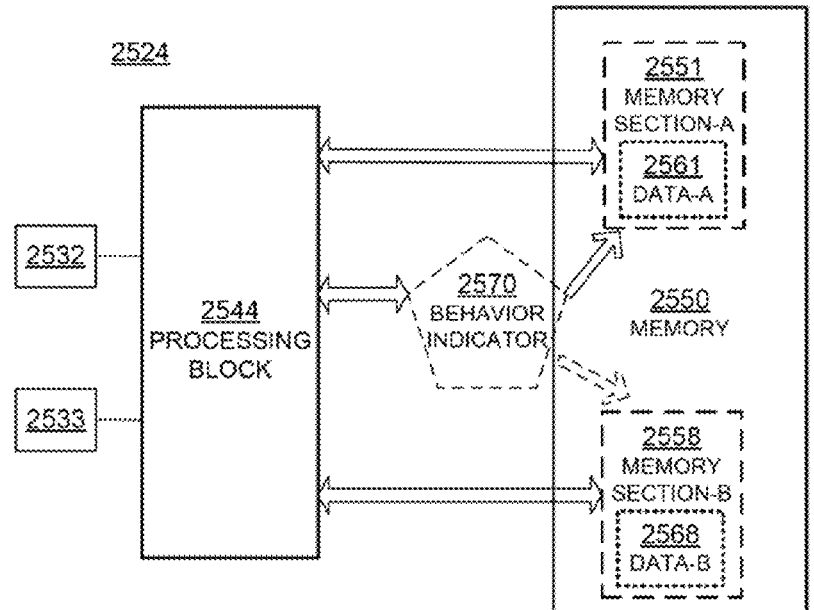
FIG. 25  *MAPPING ALTERNATIVE MEMORY SECTIONS*
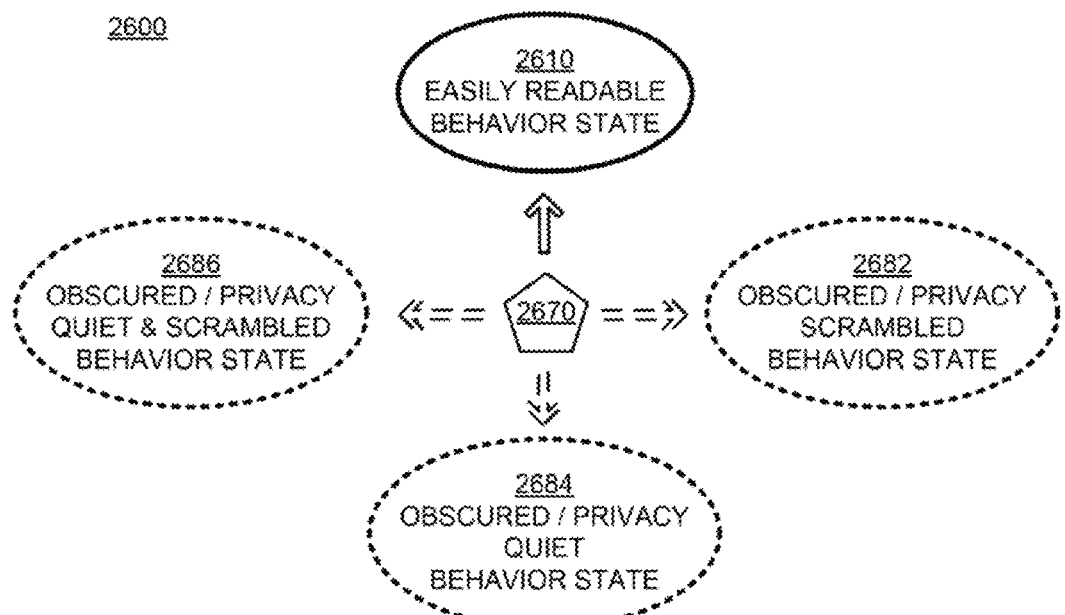
FIG. 26  *ALTERNATIVE BEHAVIOR STATES OF RFID TAG*

SWITCHING EXPOSED MEMORY FROM PRIVATE TO PUBLIC, AND VICE VERSA

RFID INTEGRATED CIRCUITS WITH ANTENNA CONTACTS ON MULTIPLE SURFACES

CROSS-REFERENCE TO RELATED APPLICATIONS

This Application is a continuation under 35 U.S.C. § 120 of U.S. patent application Ser. No. 14/714,249 filed on May 16, 2015, which is a continuation under 35 U.S.C. § 120 of U.S. patent application Ser. No. 13/904,536 filed on Aug. 23, 2013, which is a continuation under 35 U.S.C. § 120 of U.S. patent application Ser. No. 13/820,473 filed on Aug. 23, 2013, which is the U.S. National Stage filing under 35 U.S.C. § 371 of PCT Application Ser. No. PCT/US12/54531 filed on Sep. 10, 2012. The disclosures of the U.S. Patent Applications and the PCT Application are hereby incorporated by reference in their entireties. The PCT Application Ser. No. PCT/US12/54531 claims the benefit of U.S. Provisional Patent Application Ser. No. 61/623,016 filed on Apr. 11, 2012 and U.S. Provisional Patent Application Ser. No. 61/681,305 filed on Aug. 9, 2012. The disclosures of the provisional patent applications are hereby incorporated by reference in their entireties.

This application may be found to be related to U.S. Pat. No. 8,188,927 issued on May 29, 2012, the entirety of which is hereby incorporated by reference.

This application may be found to be related to U.S. Pat. No. 8,174,367 issued on May 8, 2012, the entirety of which is hereby incorporated by reference.

This application may be found to be related to U.S. Pat. No. 8,228,175 issued on Jul. 24, 2012, the entirety of which is hereby incorporated by reference.

This application may be found to be related to U.S. Pat. No. 7,482,251 issued on Jan. 27, 2009, the entirety of which is hereby incorporated by reference.

BACKGROUND

Radio-Frequency Identification (RFID) systems typically include RFID readers, also known as RFID reader/writers or RFID interrogators, and RFID tags. RFID systems can be used to inventory, locate, identify, authenticate, configure, enable/disable, and monitor items to which the tags are attached or in which the tags are embedded. RFID systems may be used in retail applications to inventory and track items; in consumer- and industrial-electronics applications to configure and monitor items; in security applications to prevent loss or theft of items; in anti-counterfeiting applications to ensure item authenticity; and in myriad other applications.

RFID systems operate by an RFID reader interrogating one or more tags using a Radio Frequency (RF) wave. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back a responding RF wave (a response). A tag may generate the response either originally, or by reflecting back a portion of the interrogating RF wave in a process known as backscatter. Backscatter may take place in a number of ways.

The reader receives, demodulates, and decodes the response. The decoded response may include data stored in the tag such as a serial number, price, date, time, destination, encrypted message, electronic signature, other data, any combination of tag data, and so on. The decoded response may also include status information or attributes about the tag or item such as a tag status message, item status message, configuration data, and so on.

An RFID tag typically includes an antenna and an RFID integrated circuit (IC) comprising a radio section, a power management section, and frequently a logical section, a memory, or both. In some RFID ICs the logical section may include a cryptographic algorithm which may rely on one or more passwords or keys stored in tag memory. In earlier RFID tags the power management section often used an energy storage device such as a battery. RFID tags with an energy storage device are known as battery-assisted, semi-active, or active tags. Advances in semiconductor technology have miniaturized the IC electronics so much that an RFID tag can be powered solely by the RF signal it receives. Such RFID tags do not include an energy storage device and are called passive tags. Of course, even passive tags typically include temporary energy- and data/flag-storage elements such as capacitors or inductors.

In typical RFID tags the IC is electrically coupled to the antenna, which in turn is disposed on a substrate. As technology advances and ICs shrink, assembling, aligning, and coupling the IC to the antenna becomes challenging.

BRIEF SUMMARY

This summary introduces a selection of concepts in a simplified form that are further described below in the Detailed Description. This summary is not intended to identify key features or essential features of the claimed subject matter, nor is it intended as an aid in determining the scope of the claimed subject matter.

An RFID IC is typically electrically coupled to an antenna via two or more antenna contacts situated on a single surface of the IC, that couple to two or more antenna terminals when the IC is assembled onto the antenna. This coupling may be face-down, by placing the IC face down on the antenna terminals such that the antenna contacts electrically couple to the terminals. This face-down case involves aligning the antenna contacts with the antenna terminals during assembly and making an electrical (galvanic, capacitive, or inductive) connection between them. Or it may be face-up, by placing the IC face up on the substrate and attaching bondwires between the antenna contacts and the antenna terminals. This face-up case involves attaching wires from the antenna contacts to the antenna terminals. Because the antenna contacts are situated on a single surface of the IC, as IC sizes shrink the contacts also shrink, often both in size (the area of each contact) and spacing (the distance between contacts). This shrinkage increases the cost of coupling the antenna contacts to the antenna terminals, in the face-down case due to alignment tolerances, and in the face-up case due to bondwire attachment tolerances. Both cases involve complicated assembly machines with consequent high cost. Using an intermediate element between the IC and the antenna, such as a strap or an interposer, does not alleviate the problem because the IC-to-strap alignment then becomes the bottleneck.

Embodiments are directed to placing the antenna contacts on different surfaces of the IC, and using antennas and assembly methods that electrically couple the antenna terminals to the different surfaces. For example, one contact may be disposed on one surface of the IC, and another contact may be disposed on the opposing surface of the IC. Using multiple IC surfaces increases the effective area for, and provides a natural separation between, the antenna contacts. The result is simplified and lower-cost IC-to-antenna assembly.

Embodiments are also directed to an RFID IC having first and second antenna contacts, and a first circuit block that is electrically coupled between them. The first antenna contact is disposed on a first surface of the IC and the second antenna contact is disposed on a second surface of the IC different from the first. The first and second antenna contacts are electrically disconnected from each other, although in some embodiments the first circuit block may be capable of electrically connecting and disconnecting them. Two elements are said to be electrically connected when a low-impedance electrical path exists between them, and are said to be electrically disconnected when no such low-impedance path is present. Of course, electrically disconnected antenna contacts will always have some unavoidable stray capacitive or inductive coupling between them, but the intent of the disconnection is to minimize this stray coupling to a negligible level when compared with an electrically connected path.

Embodiments are further directed to a method of manufacturing an RFID IC. The method includes forming a first antenna contact on a first surface of the IC, forming a second antenna contact on a second surface of the IC different from the first, and electrically coupling a first circuit block to the first and second antenna contacts.

Embodiments are also directed to a method for generating an RF response (a responding RF wave) from an RFID IC having a first antenna contact disposed on a first surface of the IC and a second antenna contact disposed on a second surface of the IC different from the first. The method includes providing data to be encoded in the response and electrically connecting and disconnecting the first and second antenna contacts through an electrically conductive substrate to generate the response.

Embodiments are also directed to an RFID tag having an RFID IC with a first antenna contact disposed on a first surface of the IC and a second antenna contact disposed on a second surface of the IC different from the first. The tag includes a substrate having a first antenna segment electrically coupled to the first antenna contact and a second antenna segment electrically coupled to the second antenna contact.

Embodiments are further directed to a portion of an RFID tag including an RFID IC with a first antenna contact disposed on a first surface of the IC, a second antenna contact disposed on a second surface of the IC different from the first, and a layer of conductive material disposed on a surface of a nonconductive material. The first antenna contact is electrically coupled to the layer of conductive material such that the conductive layer and the second antenna contact form an antenna port configured to couple with an antenna.

Embodiments are also directed to a method for fabricating an RFID tag. The method includes dispensing an RFID IC with a first antenna contact disposed on a first surface of the IC and a second antenna contact disposed on a second surface of the IC different from the first onto a tag substrate such that at least one of the first and second antenna contacts electrically couple to an antenna segment on the substrate.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying Drawings, in which:

FIGS. 21A-B illustrate RFID tag front-end equivalent circuits including a tuning circuit according to embodiments.

FIG. 25 is a block diagram of components of an electrical circuit formed in a tag IC according to embodiments.

FIG. 26 is a conceptual diagram illustrating how the tag can be in one of different behavior states according to embodiments.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
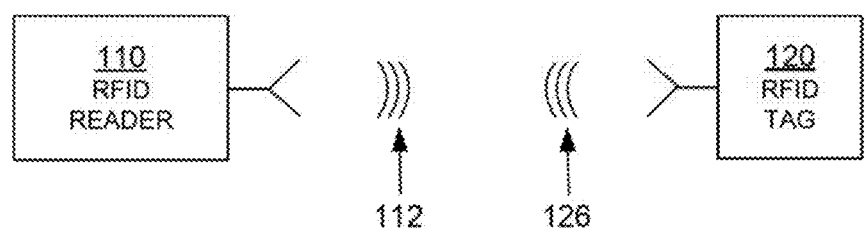
FIG. 1 is a block diagram of components of an RFID system.

FIG. 1 is a diagram showing components of a typical RFID system 100, incorporating embodiments. An RFID reader 110 transmits an interrogating RF wave 112. RFID tag 120 in the vicinity of reader 110 may sense interrogating RF wave 112 and generate wave 126 in response. RFID reader 110 senses and interprets wave 126.

Reader 110 and tag 120 communicate via waves 112 and 126. While communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration symbol, and so on. Symbols can be implemented for exchanging binary data, such as "0" and "1" if desired. When the symbols are processed internally by reader 110 and tag 120 they can be treated as values, numbers, and so on.

Tag 120 can be a passive tag, or an active or battery-assisted tag (i.e., having its own power source). When tag 120 is a passive tag it is powered from wave 112.

Figure 2:
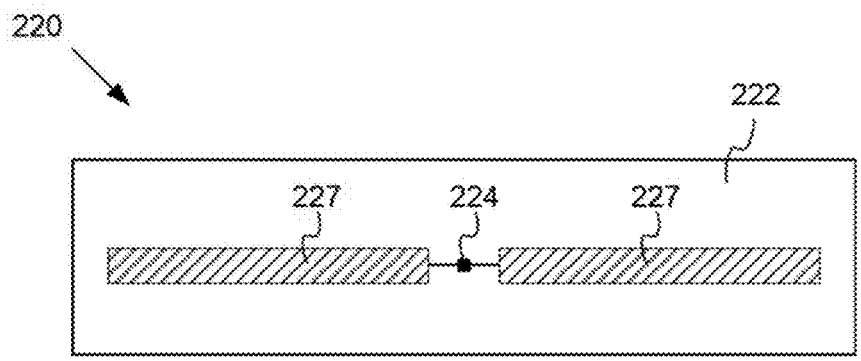
FIG. 2 is a diagram showing components of a passive RFID tag, such as a tag that can be used in the system of FIG. 1.

FIG. 2 is a representative diagram of an RFID tag 220, which may function as tag 120 of FIG. 1. Tag 220 is drawn as a passive tag, meaning it does not have its own power source. Much of what is described in this document, however, also applies to active and battery-assisted tags (including this description of tag 220).

Tag 220 is typically (although not necessarily) formed on a substantially planar inlay 222, which can be made in many ways known in the art. Tag 220 includes an electrical circuit which is preferably implemented as an integrated circuit (IC) 224. In some embodiments, IC 224 may be implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable antenna contacts on IC 224 and antenna terminals on antenna segments 227 (neither the contacts nor terminals are shown in FIG. 2).

IC 224 is shown with a single antenna port, comprising two antenna contacts electrically coupled to the two antenna segments 227 which are shown here forming a dipole. Many other embodiments are possible using any number of ports, contacts, antennas, and/or antenna segments. Antenna segments 227 are shown here forming a dipole antenna, but in other embodiments may form only part of an antenna.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response wave 126 from wave 112 transmitted by the reader. Electrically connecting and disconnecting the antenna contacts of IC 224 can modulate the antenna's reflectance, as can a variety of other means.

In the embodiment of FIG. 2, antenna segments 227 are separate from IC 224. In other embodiments, antenna segments may alternatively be formed on IC 224. Tag antennas according to embodiments may be designed in any form and are not limited to dipoles. For example, the tag antenna may be a patch, a slot, a loop, a coil, a horn, a spiral, or any other suitable antenna.

The components of the RFID system of FIG. 1 may communicate with each other in any number of modes. One such mode is called full duplex. Another such mode is called half-duplex, and is described below.

Figure 3:
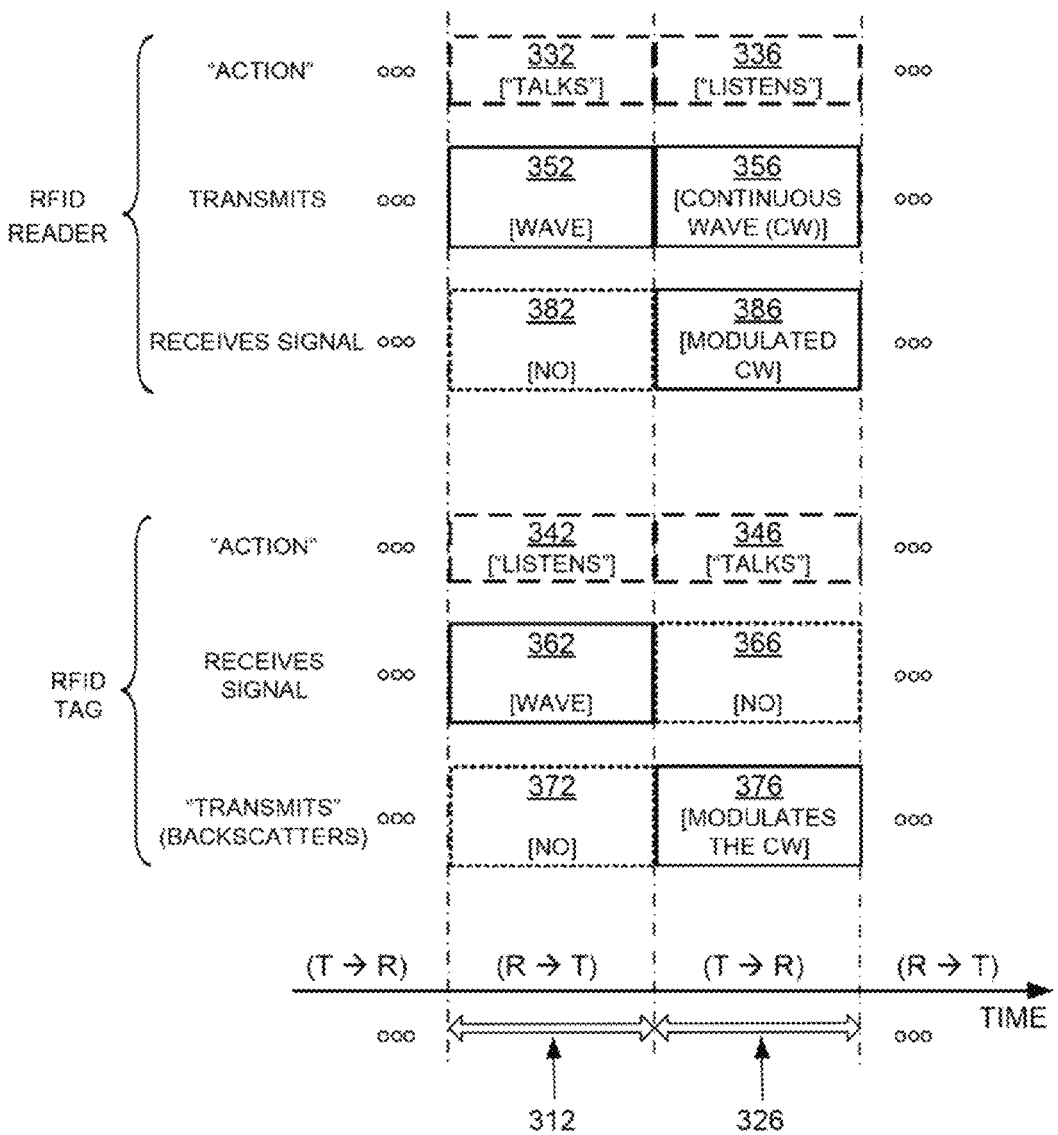
FIG. 3 is a conceptual diagram for explaining a half-duplex mode of communication between the components of the RFID system of FIG. 1.

FIG. 3 is a conceptual diagram 300 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual technical behavior, during interval 312, reader 110 talks to tag 120 as follows. According to block 352, reader 110 transmits wave 112, which was first described in reference to FIG. 1. At the same time, according to block 362, tag 120 receives wave 112 and processes it, to extract data and so on. Meanwhile, according to block 372, tag 120 does not backscatter with its antenna, and according to block 382, reader 110 has no wave to receive from tag 120.

During interval 326, tag 120 talks to reader 110 as follows. According to block 356, reader 110 transmits a Continuous Wave (CW), which can be thought of as a carrier signal that typically encodes no information. As discussed before, this carrier signal serves both to be harvested by tag 120 for its own internal power needs, and also as a wave that tag 120 can backscatter. Indeed, during interval 326, according to block 366, tag 120 does not receive a signal for processing. Instead, according to block 376, tag 120 modulates the CW emitted according to block 356, so as to generate backscatter wave 126. Concurrently, according to block 386, reader 110 receives backscatter wave 126 and processes it.

Figure 4:
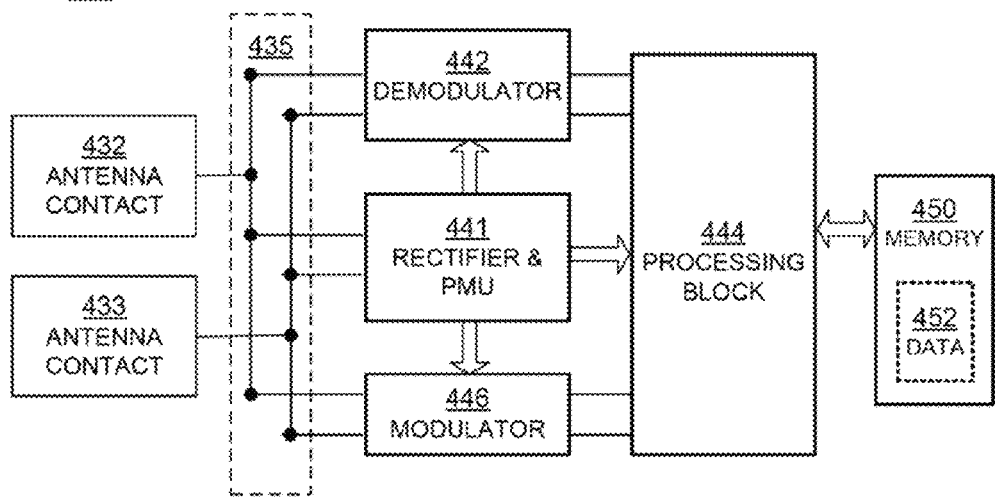
FIG. 4 is a block diagram showing a detail of an RFID IC, such as the one shown in FIG. 2.

FIG. 4 is a block diagram showing a detail of an RFID IC, such as the one shown in FIG. 2. Electrical circuit 424 in FIG. 4 may be formed in an IC of an RFID tag, such as IC 224 of FIG. 2. Circuit 424 has a number of main components that are described in this document. Circuit 424 may have a number of additional components from what is shown and described, or different components, depending on the exact implementation.

Circuit 424 shows two antenna contacts 432, 433, suitable for coupling to antenna segments such as segments 227 of RFID tag 220 of FIG. 2. When the two antenna contacts form the signal input and return from/to an antenna they are often referred-to as an antenna port. Antenna contacts 432, 433 may be made in any suitable way, such as from metallic pads and so on. In some embodiments circuit 424 uses more than two antenna contacts, especially when tag 220 has more than one antenna.

Circuit 424 also includes signal-routing section 435 which may include signal wiring, a receive/transmit switch that can selectively route a signal, and so on.

Circuit 424 also includes a rectifier and PMU (Power Management Unit) 441 that harvests energy from the RF wave received by antenna 227 to power the circuits of IC 424 during either or both reader-to-tag (R→T) and tag-to-reader (T→R) sessions. Rectifier and PMU 441 may be implemented in any way known in the art. In some embodiments, particularly those in which tag 220 includes more than one antenna, rectifier and PMU 441 may include more than one rectifier.

Circuit 424 additionally includes a demodulator 442 that demodulates the RF signal received via antenna contacts 432, 433. Demodulator 442 may be implemented in any way known in the art, for example including a slicer, amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving antenna contacts 432, 433, and therefore driving the load presented by the electrically coupled antenna segment or segments. The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to stores data 452. At least a portion of memory 450 is preferably implemented as a Nonvolatile Memory (NVM), which means that data 452 is retained even when circuit 424 does not have power, as is frequently the case for a passive RFID tag.

In terms of processing a signal, circuit 424 operates differently during a R→T session and a T→R session. The different operations are described below, in this case with circuit 424 representing an IC of an RFID tag.

Figure 5A:
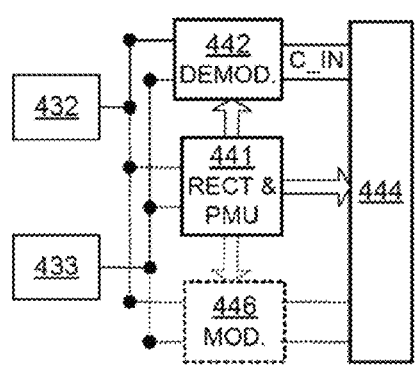
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session (receive mode of operation) during time interval 312 of FIG. 3. An RF wave received from antenna contacts 432, 433, is demodulated by demodulator 442. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, but typically only for converting RF power. Modulator 446 generally does not transmit during a R→T session, and typically does not interact with the received RF wave significantly, either because switching action in section 435 of FIG. 4 disconnects modulator 446 from the RF wave, or because modulator 446 is designed to have a suitable impedance, and so on.

Although modulator 446 is typically inactive during a R→T session, it need not be so. For example, during a R→T session modulator 446 could be adjusting its own parameters for operation in a future session, and so on.

Figure 5B:
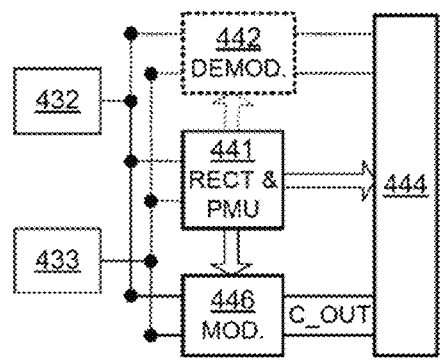

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. C_OUT is then modulated by modulator 446 and provided to antenna segments such as segments 227 of RFID tag 220 via antenna contacts 432, 433.

Version 524-B shows as relatively obscured those components that do not play a part in processing a signal during a T→R session. Rectifier and PMU 441 may be active, but typically only for converting RF power. Demodulator 442 generally does not receive during a T→R session, and typically does not interact with the transmitted RF wave significantly, either because switching action in section 435 of FIG. 4 disconnects demodulator 442 from the RF wave, or because demodulator 442 is designed to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as Version 1.2.0 of the Class-1 Generation-2 UHF RFID Protocol for Communications at 860 MHz-960 MHz ("Gen2 Specification") by EPCglobal, Inc., which is hereby incorporated by reference in its entirety. In embodiments where electrical circuit 424 includes multiple demodulators and/or multiple modulators, each may be configured to support different protocols or different sets of protocols. A protocol specifies, in part, how symbols are encoded for communication, and may include modulations, encodings, rates, timings, or any other parameters associated with data communications.

Embodiments may also include methods of manufacturing a tag as described herein. These methods may be performed in conjunction with one or more human operators. These human operators need not be collocated with each other, and each can be with a machine that performs a portion of the manufacturing.

Embodiments for manufacturing a tag as described herein may additionally include programs, and methods of operating the programs. A program is generally defined as a group of steps or instructions leading to a desired result, due to the nature of the elements in the steps and their sequence.

Executing a program's steps or instructions requires manipulating physical quantities that represent information. These quantities may be electrical, magnetic, and electromagnetic charges or particles, states of matter, and in the more general case the states of any physical elements. These quantities are often transferred, combined, compared, and processed according to the steps or instructions. It is convenient at times to refer to the information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Executing a program's steps or instructions may further require storage media that have stored thereon a program's instructions and/or data, typically in a machine-readable form. This storage media is typically termed a memory, read by a processor or other machine element. In electronic devices the memory may be implemented as Read Only Memory (ROM), Random Access Memory (RAM), and many others as will be well known to those skilled in the art. In some embodiments the memory may be volatile and in others nonvolatile.

Even though it is said that a program is stored in a memory, it should be clear to a person skilled in the art that the program need not reside in a single memory, or even be executed by a single machine. Various portions, modules, data, or features of the program may reside in separate memories and be executed by separate machines.

Often, for sake of convenience, it is desirable to implement and describe a program for manufacturing a tag according to embodiments as software. The software can be unitary or can be considered as various interconnected software modules.

Embodiments of an RFID tag or of a program for manufacturing an RFID tag as described herein can be implemented as hardware, software, firmware, or any combination thereof. It is advantageous to consider such a tag as subdivided into components or modules. A person skilled in the art will recognize that some of these components or modules can be implemented as hardware, some as software, some as firmware, and some as a combination.

As described above, an RFID tag may be manufactured by placing an RFID IC (e.g., IC 224 in FIG. 2) on an antenna (e.g., antenna 227) disposed on a substrate (e.g. substrate 222) and electrically coupling contacts of the IC to terminals of the antenna. Conventional antenna contacts are disposed on a single surface of the IC, and electrically couple to the antenna terminals either by placing the IC face down on the antenna terminals such that the antenna contacts electrically couple to the antenna terminals, or by placing the IC face-up and attaching bondwires between the antenna contacts and the antenna terminals. However, as described above, as IC sizes shrink the corresponding antenna ports become smaller, both in terms of contact size and contact spacing. This shrinkage increases the cost of coupling the antenna contacts to the antenna terminals, in the face-down case due to tight alignment tolerances, and in the face-up case due to tight bondwire attachment tolerances.

Figure 6:
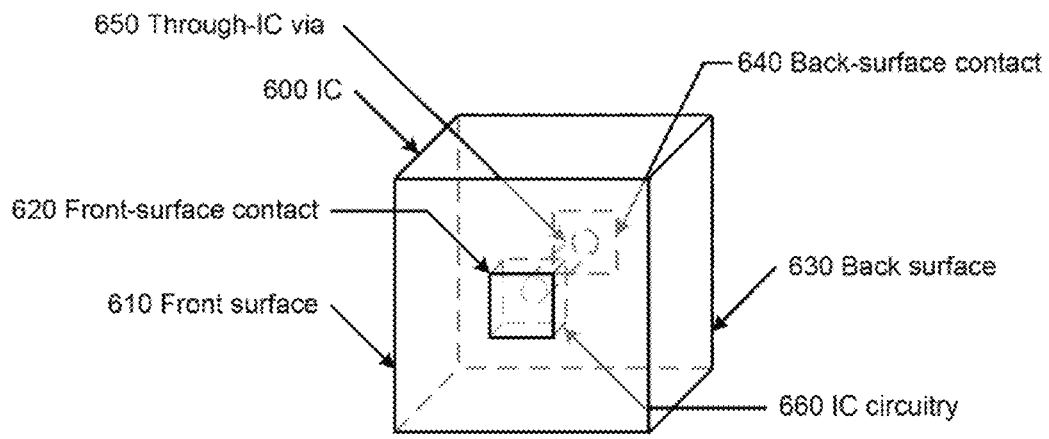
FIG. 6 is a conceptual diagram of an IC with antenna contacts on two surfaces (a dual-sided IC).

Disposing the antenna contacts on different surfaces of the IC addresses this issue. FIG. 6 is a conceptual diagram of a dual-sided IC 600 with antenna contacts on two different surfaces. In some embodiments IC 600 may be an RFID IC as described in relation to FIG. 2, although the concept is not limited to RFID ICs. Typical ICs have six surfaces (front surface 610, back surface 630, and four sides), although ICs with more-complex shapes may have more or fewer surfaces. In typical embodiments IC circuitry 660 is disposed in or on one of these surfaces and is electrically coupled to two antenna contacts disposed on any two non-identical surfaces. FIG. 6 shows a representative embodiment with IC circuitry on front surface 610, a front-surface contact 620 that couples directly to IC circuitry 660, and a back-surface contact 640 that couples to IC circuitry 660 by means of through-IC via 650. In FIG. 6, the front-surface contact 620 is only on the front surface 610 and the back-surface contact 640 is only on the back surface 630. However, in some embodiments, the front-surface contact 620 and/or the back-surface contact 640 may be present on multiple surfaces. For example, the front-surface contact 620 may be on the front surface 610 as well as on the back-surface 630 and/or any of the other four, unlabeled surfaces. Similarly, the back-surface contact 640 may be present on the back surface 630 as well as on the front surface 610 and/or any of the other four, unlabeled surfaces.

Figure 7:
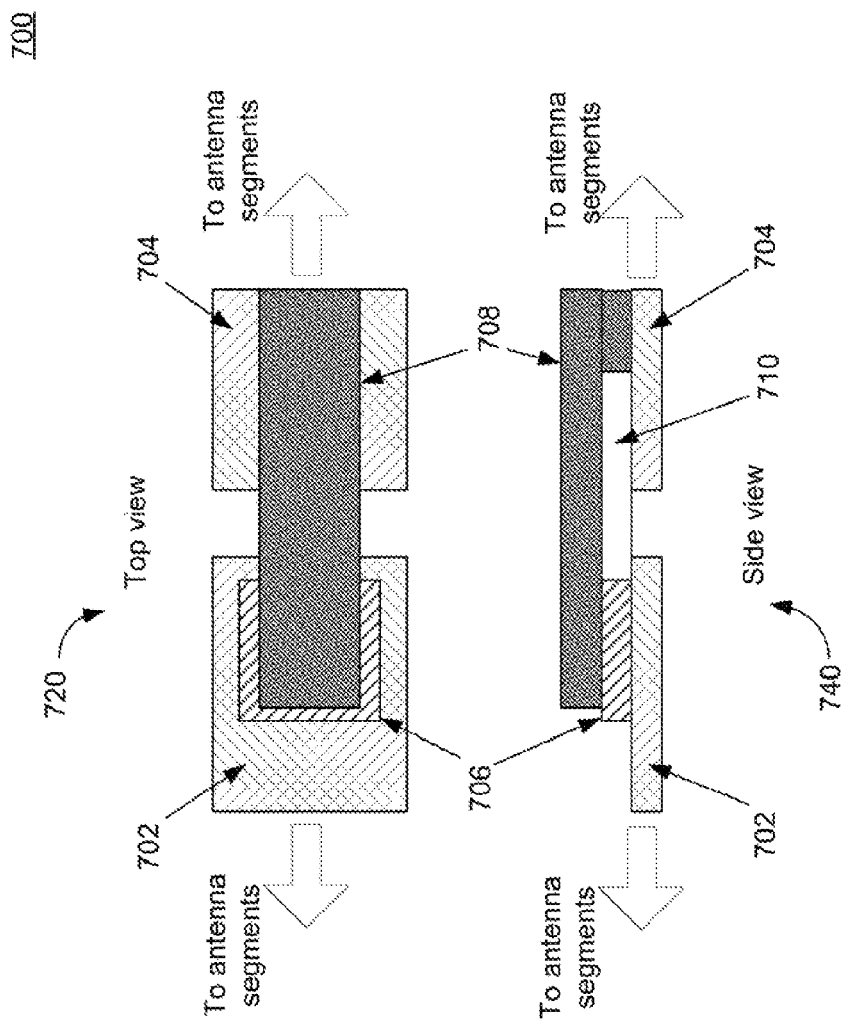
FIG. 7 is a conceptual diagram of a dual-sided IC contacting multiple antenna terminals according to embodiments.

FIG. 7 is a conceptual diagram showing a top view 720 and a side view 740 of a dual-sided IC coupled to antenna terminals 702 and 704 according to embodiments. The antenna terminals may, in turn, couple to or be part of antenna segments such as segments 227 in FIG. 2, or may form a strap or interposer suitable for connecting to antenna segments, or in the general case may be any type of precursor that allows IC 600 to be attached to an antenna or to another electrical component. In FIG. 7, dual-sided IC 706, such as IC 600 described above in relation to FIG. 6, is disposed between terminal 702 and an electrical bridge 708 such that its front-surface antenna contact (e.g., front-surface contact 620 in FIG. 6) is electrically coupled to terminal 702 and its back-surface antenna contact (e.g., back-surface contact 640 in FIG. 6) is electrically coupled to bridge 708. Bridge 708, in turn, electrically couples to terminal 704. Because IC 706 has front-to-back symmetry, it can alternatively be sandwiched between terminal 702 and bridge 708 with its back-surface antenna contact electrically coupled to terminal 702 and its front-surface antenna contact electrically coupled to bridge 708. Indeed, an advantage of the present invention is that in many embodiments IC 706 may be mounted front-side up or front-side down without impacting its operation.

In some embodiments a dielectric layer 710 may be disposed between terminal 702 and bridge 708 to prevent an inadvertent short circuit between the terminal 702 and bridge 708.

In some embodiments the electrical coupling between the elements in FIG. 7 (e.g. between IC 706, terminals 702 and 704, and/or bridge 708) may be capacitive or inductive rather than Ohmic or galvanic and may include a dielectric layer disposed between them. For example, a layer of non-conductive paste (NCP) or film may be disposed between IC 706 and terminal 702 and/or between IC 706 and bridge 708, and the coupling between them may be capacitive.

Figure 8:
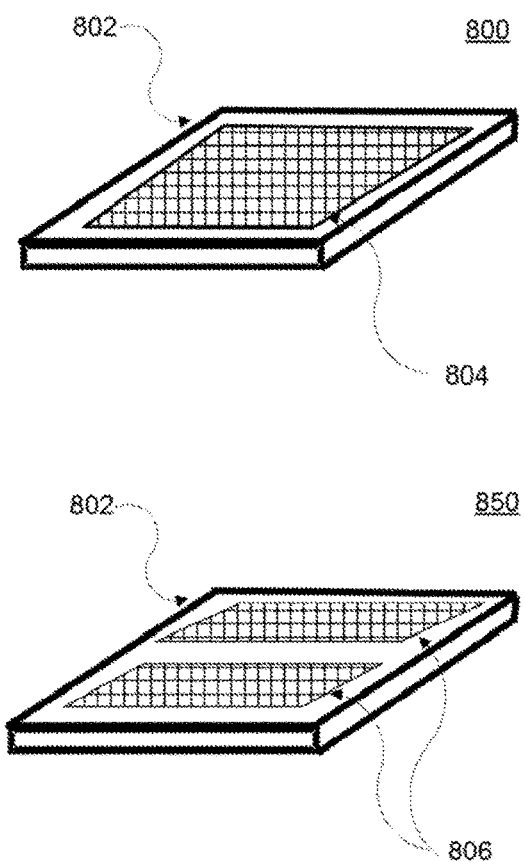
FIG. 8 illustrates IC configurations using large antenna contacts according to embodiments.

In some embodiments the front-surface and/or back-surface contacts of IC 706 may use one or more large contact pads, as described in U.S. patent application Ser. No. 13/456,653 filed on Apr. 26, 2012, which has been incorporated by reference in its entirety. FIG. 8 illustrates IC configurations 800 and 850 using large contact pads according to embodiments. In IC configuration 800, IC 802 has a single large contact pad 804 that substantially spans a surface of the IC. In IC configuration 850, IC 802 has two large contact pads 806 that together span a surface of the IC. Embodiments with more than two large contact pads are possible as well. For clarity, IC configurations 800 and 850 show only one IC surface (the top surface), but in embodiments according to the present invention multiple surfaces of IC 802 such as the bottom surface (not visible) or a side surface of IC 802 will also have one or more contact pads (either small or large). Also, although contact pads 804 and 806 are shown in FIG. 8 spanning substantially the entire surface of IC 802, in other embodiments the contact pads may be smaller and may merely span a reasonable portion of the IC surface.

In other embodiments the contact pads may be shaped or formed in such a way as to improve adhesion between the contact pads and the antenna terminals. Examples include but are not limited to providing one or more cavities, slots, or gaps in the center of the contact pad(s) (not shown in FIG. 8) into which an adhesive (such as a conductive epoxy, nonconductive epoxy, contact adhesive, solder, or other similar material) may flow when the dual-sided IC and antenna terminals are assembled together. In this case the cavities or gaps act like grooves in a tire that prevent hydroplaning, but in the case of the present invention they provide a path for the adhesive to flow and bond.

In embodiments as disclosed herein, the large contact pads electrically couple to one or more antenna terminals or bridges (e.g., terminal 702 and/or bridge 708 in FIG. 7). Because the contact-pad area is large, the placement/alignment tolerances between the contact pads and the antenna terminals may be reduced compared to ICs with smaller antenna contacts, facilitating assembly. In some embodiments the contact pads, terminals, and/or bridges may include or be coated by a dielectric material, either naturally (such as a naturally-grown or enhanced oxide layer like aluminum oxide) or additively (such as a deposited dielectric). In such embodiments the coupling between the contact pads and the antenna terminals will typically be capacitive or inductive.

Figure 9A:
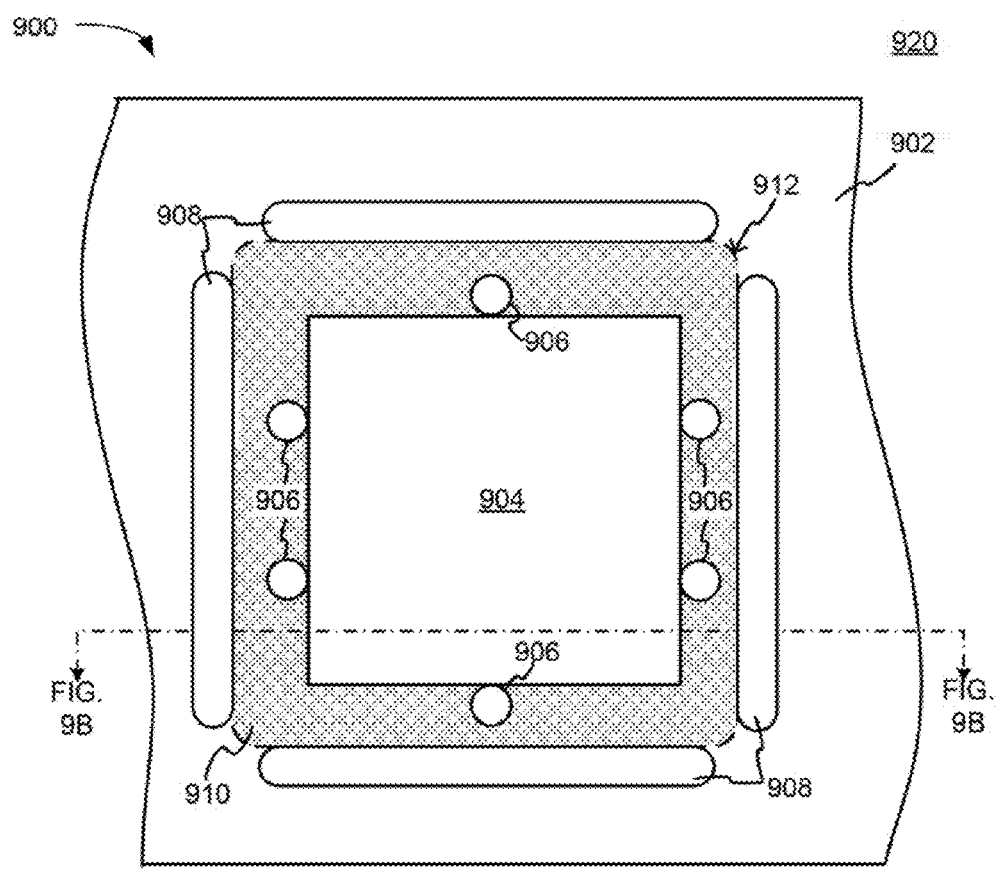
FIGS. 9A-B are top and section views of an RFID IC aligned on a substrate according to embodiments.
Figure 9B:
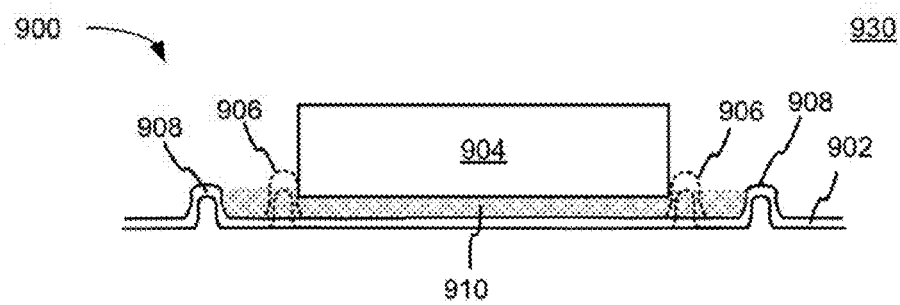

Another way to facilitate placement and alignment between the contact pads and antenna terminals is to use alignment bumps. FIGS. 9A-B show top (920) and section (930) views of an IC 904, such as dual-sided IC 600 of FIG. 6, aligned on a substrate portion 902 by alignment bumps according to embodiments. Substrate portion 902 may be part of an inlay (e.g. inlay 222 of FIG. 2) or a strap (an interposing substrate with interconnections for coupling to an inlay). When IC 904 is placed on substrate 902, alignment bumps 906 guide IC 904 into position. It should be apparent that the substrates of terminal 702 and bridge 708 may contain alignment bumps (not shown in FIG. 7), thereby facilitating assembly of dual-sided IC 706's top and bottom antenna contacts to terminal 702 and bridge 708.

In some embodiments an underfill 910 may be applied between substrate 902 and IC 904 to strengthen the physical bond and/or improve the electrical coupling between them. Underfill 910 may be conductive (anisotropic conductive paste/film or any other suitable conductive material) or nonconductive (nonconductive paste, film, oxide, or any other suitable nonconductive material). Raised substrate regions 908 may be used to contain underfill 910 during assembly. Of course, the shapes of alignment bumps 906 and raised substrate regions 908 depend on the application and need not be restricted to small round bumps and elongated raised regions. In some embodiments, raised regions similar to raised substrate regions 908 can be used to guide the alignment of an IC itself, similar to how alignment bumps may be used to guide IC alignment.

Figure 10A:
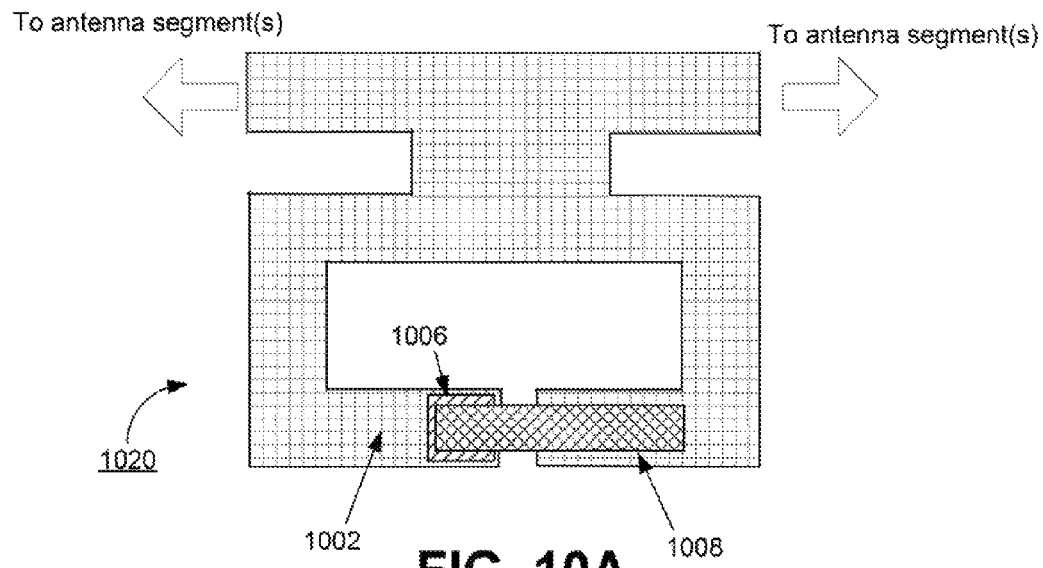
FIGS. 10A-D depict various configurations of dual-sided ICs contacting multiple antenna terminals according to embodiments.
Figure 10B:
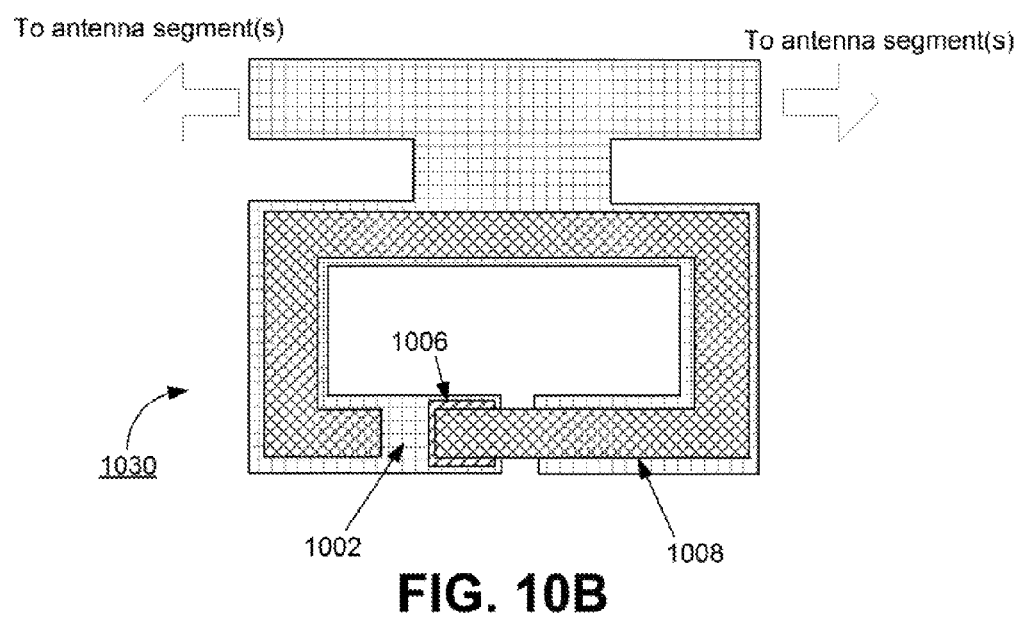
Figure 10C:
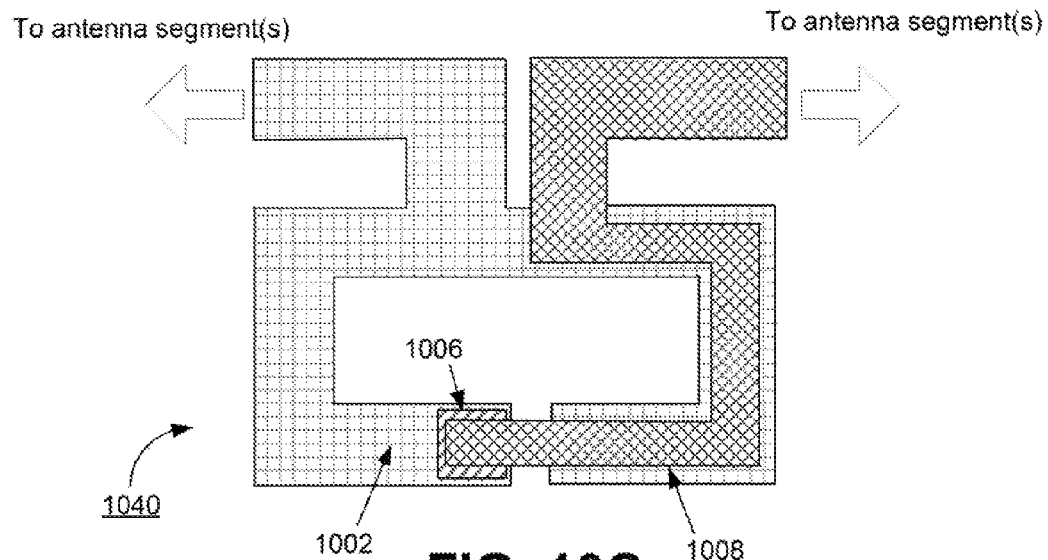
Figure 10D:
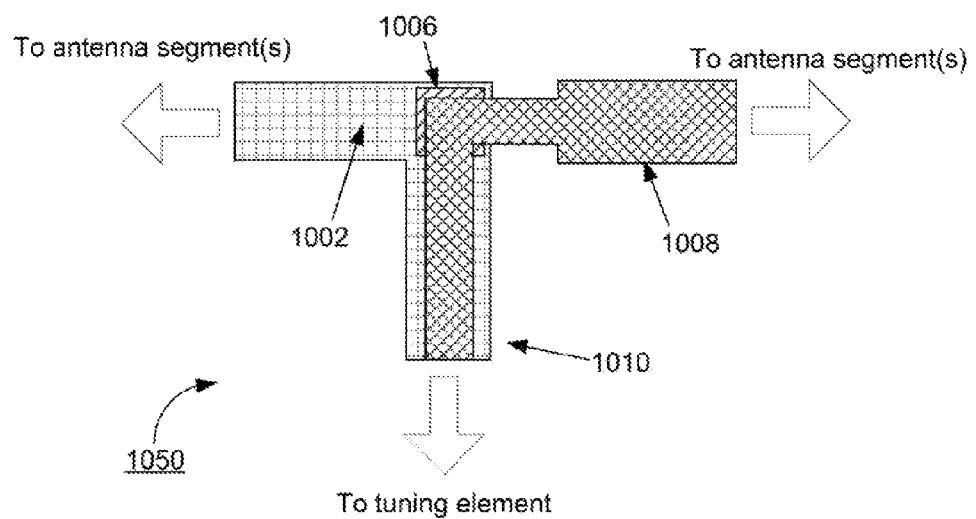
Figure 11A:
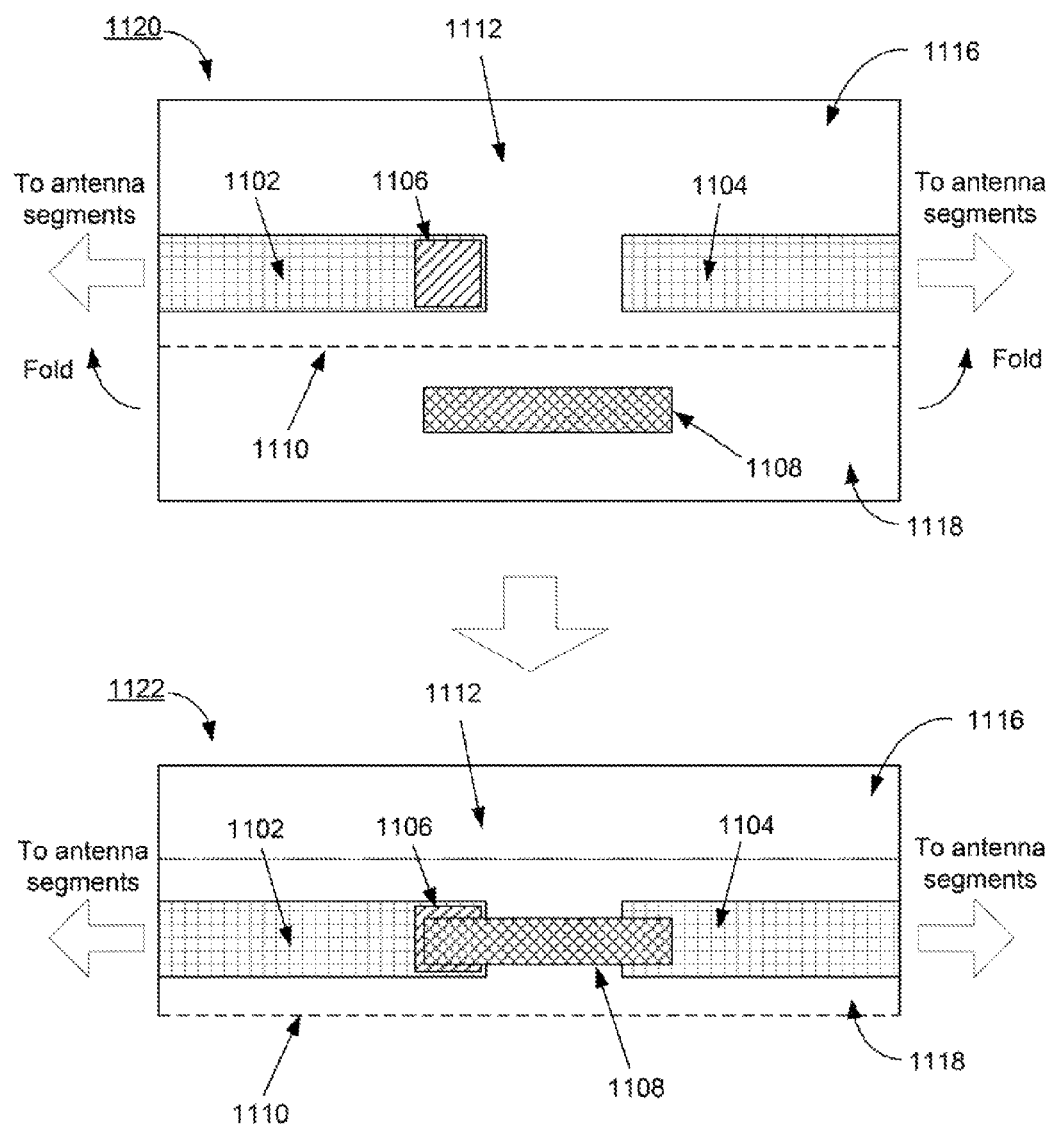
FIGS. 11A-C depict further configurations of dual-sided ICs contacting multiple antenna terminals according to embodiments.
Figure 11B:
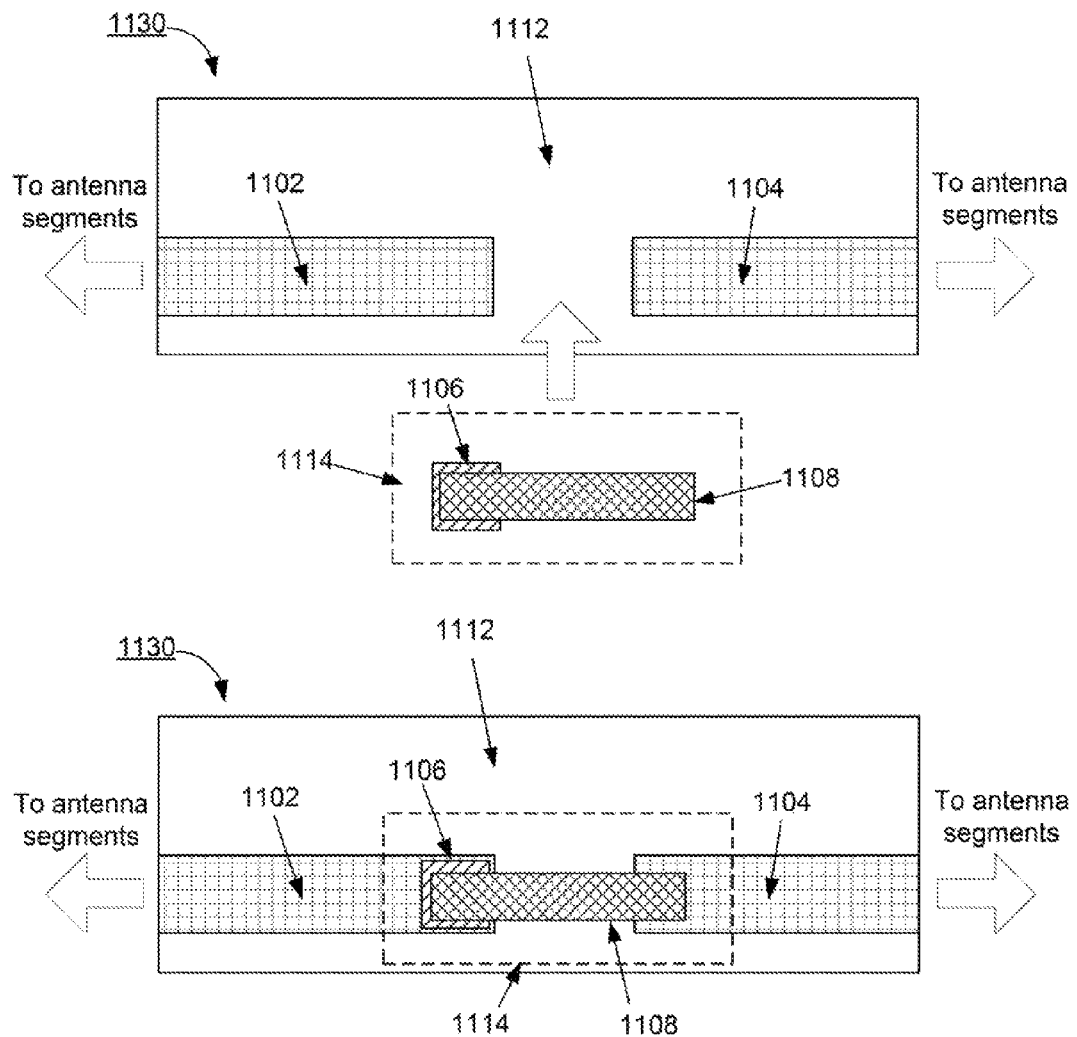
Figure 11C:
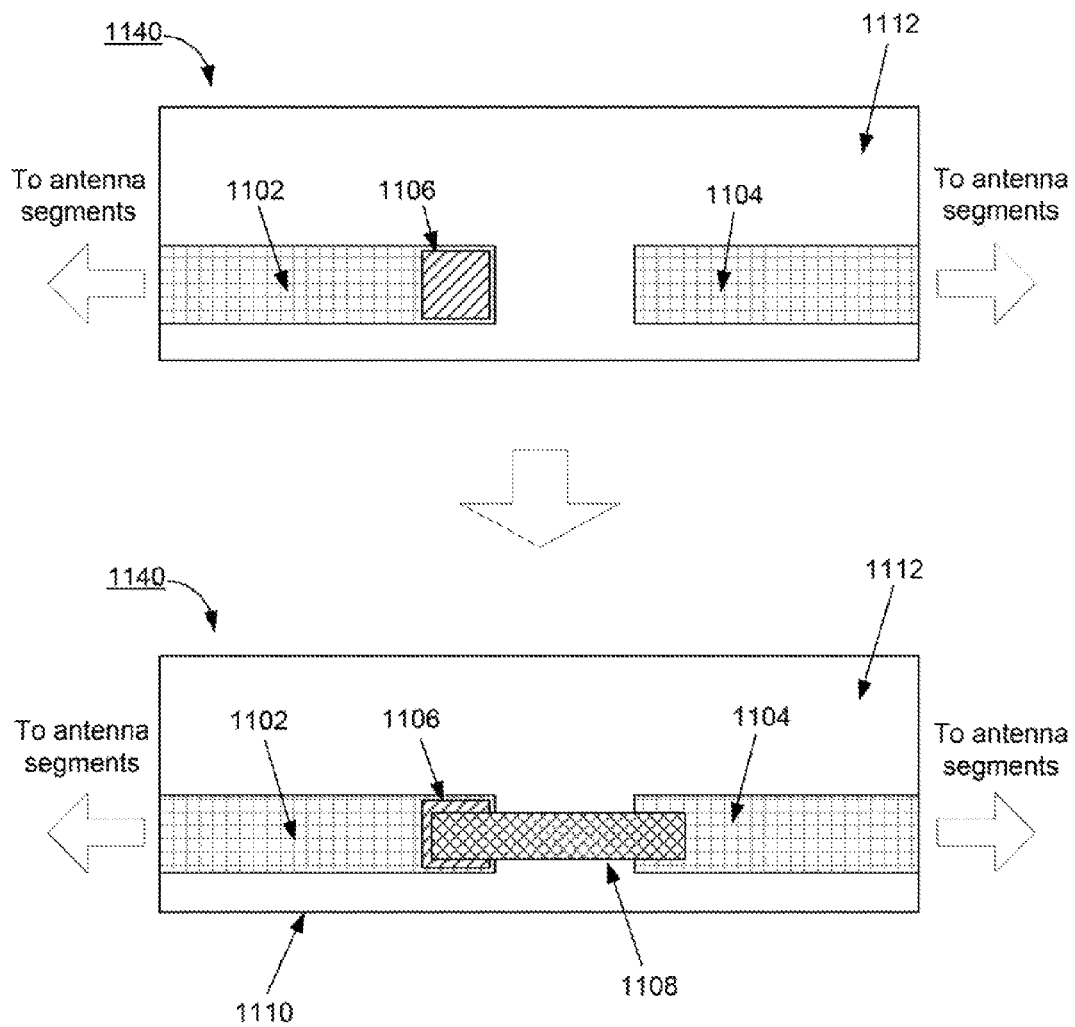
Figure 12A:
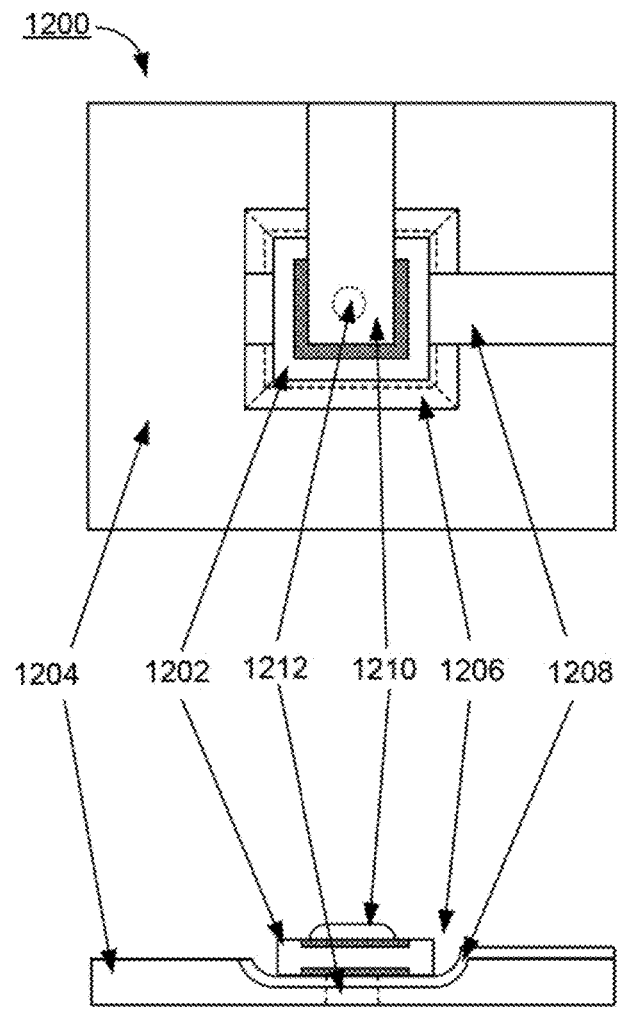
FIGS. 12A-C depict various configurations of dual-sided ICs on tag substrates according to embodiments.
Figure 12B:
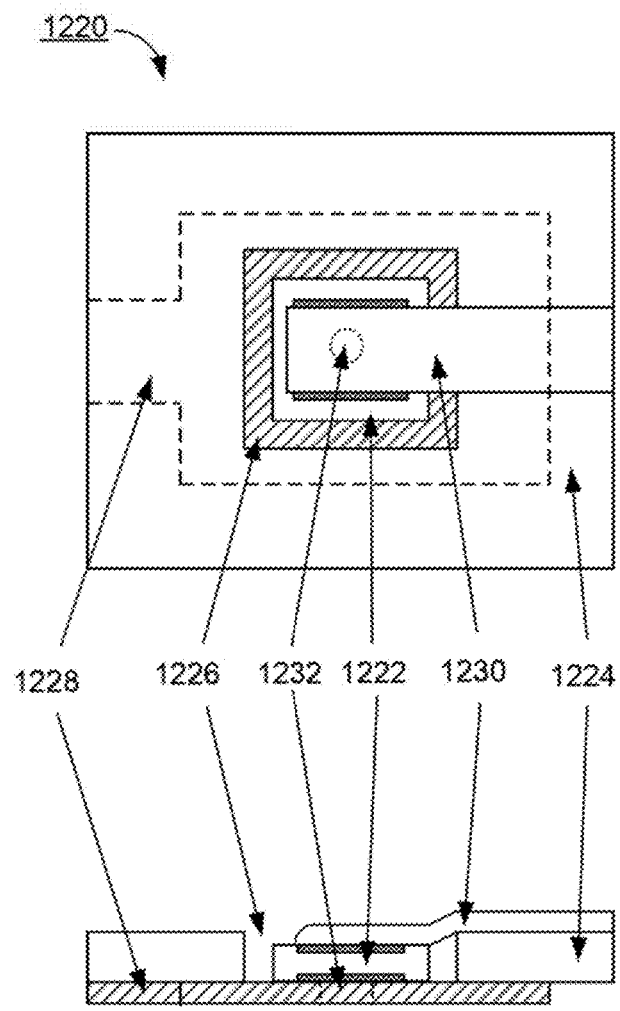
Figure 12C:
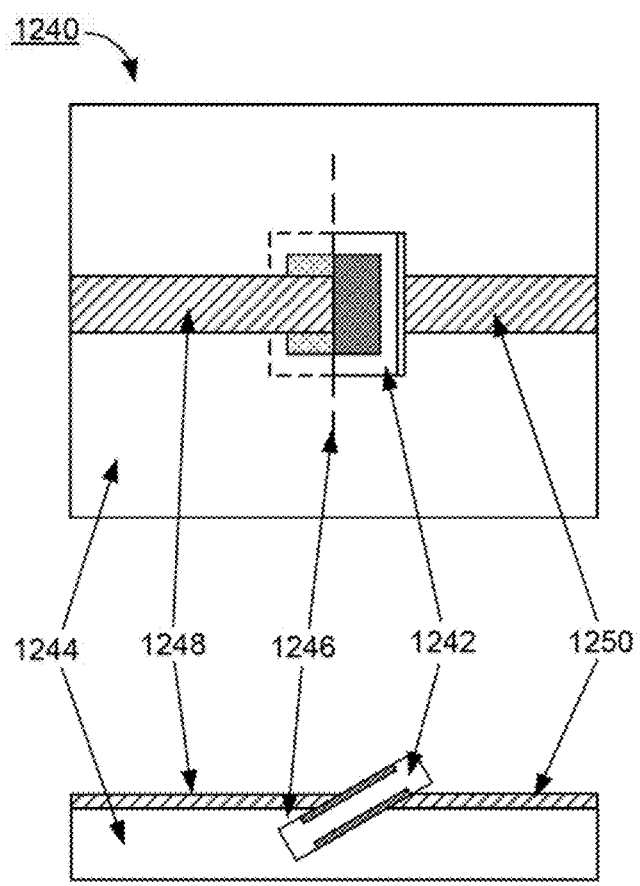

FIGS. 10, 11, and 12 depict high-level concepts of coupling and assembling dual-sided ICs to antenna terminals according to embodiments. FIGS. 10A-D depict examples of dual-sided ICs coupling to antenna terminals. FIGS. 11A-C depict examples of assembling dual-sided ICs to antenna terminals. And FIG. 12A-C depict examples of tag substrates that guide assembly of dual-sided ICs to antenna terminals. In all embodiments the final assembly, including IC, antenna terminal, and substrate comprises some form of layered "sandwich" including one or more layers of a metal such as aluminum or copper or tin, a dielectric such as paper or plastic or PET, and a dual-sided IC. The layers may be connected together by gluing, laminating, self-adherence, or in any other way as will be well known to those skilled in the art.

FIG. 10A depicts a configuration 1020 of a dual-sided IC 1006 disposed between a loop 1002 and a bridge 1008. One antenna contact (front-surface contact 620 or back-surface contact 640 in FIG. 6) of IC 1006 couples to a first antenna terminal of loop 1002, and another antenna contact of IC 1006 couples with bridge 1008 which, in turn, couples to a second antenna terminal of loop 1002. Loop 1002 may act as a tuning element for IC 1006, may form an antenna, and/or may couple to antenna segments such as segments 227 in FIG. 2.

FIG. 10B depicts a configuration 1030 similar to configuration 1020 in FIG. 10A, the difference being that bridge 1008 now covers a significant portion of loop 1002 to improve the electrical coupling between them. In some embodiments the electrical coupling between bridge 1008 and loop 1002 may be capacitive. In some embodiments a natural dielectric of the antenna terminal material, such as aluminum oxide on an aluminum terminal, may be disposed between bridge 1008 and loop 1002.

FIG. 10C depicts a configuration 1040 where bridge 1008 is itself an antenna terminal. The overlap between bridge 1008 and terminal 1002 allows them to couple together electrically, thereby completing a loop around IC 1008.

FIG. 10D depicts another configuration 1050 where bridge 1008 is an antenna terminal. The overlap between bridge 1008 and antenna terminal 1002 allows them to couple together electrically, in this case forming a tuning element 1010 which may be a tuning stub, a transmission line formed from the bridge/substrate/terminal sandwich, or may couple to another tuning element (not shown in FIG. 10D). In this case tuning element 1010 is an alternative to the tuning loops in FIGS. 10A, 10B, and 10C.

FIGS. 11A-C depict examples of inlays formed with dual-sided ICs according to embodiments.

FIG. 11A shows a configuration 1120 of a tag substrate 1112 partitioned into a first portion 1116 and a second portion 1118 by a fold line 1110. Tag substrate 1112 may be made from any suitable, foldable material. Tag substrate 1112 includes first and second antenna terminals 1102 and 1104 disposed on first portion 1116, and a bridge 1108 disposed on second portion 1118. A dual-sided IC 1106 disposed on first portion 1116 couples to first terminal 1102 by a first surface antenna contact of the IC; the second surface antenna contact of IC 1106 is exposed. FIG. 11A also shows configuration 1122 of the same tag substrate folded along fold line 1110. The surfaces of portions 1116 and 1118 come together, causing bridge 1108 to electrically couple to the second surface antenna contact of IC 1106 and second terminal 1104. Of course, IC 1106 could equivalently be disposed on bridge 1108 prior to folding, in which case the pre-fold configuration 1120 will appear different but the final result (configuration 1122) will be the same.

FIG. 11B depicts a tag configuration 1130 similar to that of FIG. 11A, except that bridge 1108 is disposed on a separate strap 1114. A first surface antenna contact of dual-sided IC 1106 is electrically coupled to bridge 1108, such that bridge 1108 and the second surface antenna contact of dual-sided IC 1106 form an antenna port. Strap 1114, when placed on tag substrate 1112, couples the antenna port to the terminals on substrate 1112 forming final configuration 1130 with the second surface of IC 1006 electrically coupled to terminal 1102 and bridge 1108 electrically coupled to terminal 1104. Of course, many alternative configurations are possible, including with IC 1006 initially attached to terminal 1102, terminal 1104, or bridge 1108. FIG. 11C shows an embodiment with IC 1006 initially attached to terminal 1102.

In all the above embodiments bridge 1108 may be formed on a fold of the tag substrate, on a flap or cutout of the tag substrate, on material initially separate from the tag substrate, from a conductive ink, polymer, or layer that is printed, evaporated, or deposited on the tag substrate, or in any other fashion as will be obvious to those skilled in the art. In some embodiments, the bridge 1108 may be formed of one or more bridge precursors that are deposited onto the tag substrate and then subsequently processed to form the bridge 1108, via the application of heat, pressure, or any other suitable processing means. Bridge precursors may be easily deposited on the substrate, but require additional processing to form an electrical connection to a contact or terminal. For example, a bridge precursor may include metallic particles in an ink that is first deposited and then processed such that the metallic particles form a conductive path. In some embodiments bridge 1108 includes a metallic or electrically conductive layer that is transferred and bonded to the tag substrate; in other embodiments bridge 1008 and its electrically conductive portion may be formed from two or more pieces that are bonded together to form the bridge. As noted above, in embodiments as disclosed herein the coupling may be galvanic, capacitive, and/or inductive. Bridge 1008 may be bonded to the tag substrate using heat, pressure, adhesive (e.g. epoxy), solder, stitch bonding, welding, or in any other way as will be well known to those skilled in the art.

Whereas FIGS. 11A-C depict tag structures where a bridge couples a surface antenna contact of a dual-sided IC to an antenna terminal, some embodiments do not need a bridge. For example, returning to FIG. 11A, second terminal 1104 may be disposed on second tag portion 1118 in place of bridge 1108 such that when tag substrate 1112 is folded along fold line 1110, second antenna terminal 1104 couples to the exposed surface antenna contact of dual-sided IC 1106. Similarly, in FIG. 11B, tag strap 1114 may include second terminal 1104 in place of bridge 1108, such that when the strap is disposed on tag substrate 1112 first terminal 1102 electrically couples to the exposed surface antenna contact of dual-sided IC 1106. In some embodiments, the second tag portion 1118 or the strap 1114 may include a portion of or even the entire tag antenna rather than an antenna terminal.

In some embodiments, a tag substrate with antenna terminals may be designed to facilitate and direct the placement of a dual-sided IC. FIG. 12A depicts a top view (above) and a cross-section view (below) of a tag substrate 1204 having a recessed or dimpled region 1206 for guiding the positioning of a dual-sided IC on substrate 1204. Dimpled region 1206 is sized to fit the dual-sided IC, and includes a lower antenna terminal 1208. A dual-sided IC 1202 (e.g., dual-sided IC 600 in FIG. 6) can then be deposited in the dimpled region 1206 such that a surface antenna contact of IC 1202 (e.g., front-surface contact 620 or back-surface contact 640 in FIG. 6) couples to the lower antenna terminal 1208. After the IC 1202 is deposited in dimpled region 1206, a bridge 1210 can be deposited on top of IC 1202 to couple another surface antenna contact of IC 1202 to a second antenna terminal. Whereas in FIG. 12A, bridge 1210 is depicted as orthogonal to lower antenna terminal 1208, this need not be the case. For example, bridge 1210 may be in-line with lower antenna terminal 1208 (i.e., bridge 1210 may extend to the left instead of to the top in the top view of the substrate), or may extend in any suitable direction (e.g., to top, bottom, at any angle, or any other suitable direction including out of the plane of tag substrate 1204). **10113*j* In some embodiments, one or more apertures 1212 may be formed in the bottom of dimpled region 1206 and may be used for placing and positioning the IC 1202, as described below in relation to FIG. 13A. Preferably, aperture(s) 1212 are smaller than IC 1202, such that IC 1202 cannot pass through. However, aperture(s) 1212** may provide sufficient area for fluids (i.e., liquids or gases or adhesives or solder) to pass through.

In some embodiments, a hole in the tag substrate may direct the placing and positioning of a dual-sided IC. This through-substrate hole may be used instead of or in addition to a dimpled region. FIG. 12B depicts a top view (above) and a cross-section view (below) of a tag substrate 1224 having a hole 1226 sized to fit a dual-sided IC 1222. In contrast to dimpled region 1206 of tag substrate 1204 described above, hole 1226 passes completely through tag substrate 1224. To prevent IC 1222 from falling completely through hole 1226, and for coupling to one of IC 1222's surface antenna contacts, tag substrate 1224 includes a lower antenna terminal 1228 disposed on one side of tag substrate 1224, which substantially occludes hole 1226 and together with hole 1226 forms a pocket for IC 1222. When IC 1222 is deposited within hole 1226, a surface antenna contact of IC 1222 (e.g., front-surface contact 620 or back-surface contact (40 in FIG. 6) couples to lower antenna terminal 1228. Subsequently, a bridge 1230 may be disposed above IC 1222 to couple another antenna terminal to the other surface antenna contact of IC 1222. Similar to the description for FIG. 12A, bridge 1230 can extend in any suitable direction, including as a sheet that extends in all directions around IC 1222. Likewise, lower antenna terminal 1228 may extend in any direction or may be a sheet. In some embodiments, one or more apertures 1232 similar to aperture(s) 1212 in FIG. 12A may be formed in lower antenna terminal 1228 to aid in placing and positioning IC 1222.

Whereas dimpled region 1206 in FIG. 12A and hole 1226 in FIG. 12B are shown as square, they need not be so. For example, dimpled region 1206 and/or hole 1226 may be rectangular, circular, elliptical, hexagonal, or of any suitable convex or concave shape. In some embodiments, dimpled region 1206/hole 1226 are sufficiently large to fit an entire IC, but in other embodiments, dimpled region 1206/hole 1226 may only be large enough to accommodate a portion of an IC.

FIG. 12C depicts another method to couple a dual-sided ICs surface contacts to antenna terminals on a substrate according to embodiments. Diagram 1240 depicts a top view (above) and a cross-section view (below) of a tag substrate 1244 having a first antenna terminal 1248 and a second antenna terminal 1250. A slot 1246 cut into tag substrate 1244 separates first antenna terminal 1248 and second antenna terminal 1250. A dual-sided IC 1242 is placed within slot 1246 such that one surface contact of IC 1242 couples to first antenna terminal 1248 and another surface contact of IC 1242 couples to second antenna terminal 1250. Slot 1246, which is shown inclined with respect to the plane of substrate 1244, may be inclined as any angle, or may even be orthogonal to the plane of tag substrate 1244 (i.e., downward in the cross-section view). In some embodiments the terminals may be fabricated as a single terminal, then slot 1246 cut through this single terminal to separate it into two antenna terminals 1248 and 1250. In some embodiments, slot 1246 may be cut entirely through substrate 1244, instead of only through a portion as shown in the cross-section view. In some embodiments one or more apertures (not shown) may be formed between the bottom of slot 1246 and the bottom of tag substrate 1244 for IC placement and positioning.

Using a dual-sided IC simplifies tag assembly. Because a dual-sided IC has surface contacts on opposing sides, either side can be placed onto a tag substrate. In addition, because a dual-sided IC typically has surface contacts on its largest sides, a dual-sided IC can simply be dropped onto a tag substrate and in most cases land with a surface contact facing the tag substrate. Therefore, the IC does not necessarily have to be maintained in a particular position or orientation before assembly, thus allowing simpler, more cost-effective assembly methods. For example, instead of having to be individually picked and placed onto tag substrates, as conventional ICs do, dual-sided ICs can be handled and dispensed in bulk, as described below. However, dual-sided ICs may still be compatible with conventional pick-and-place techniques.

Figure 13A:
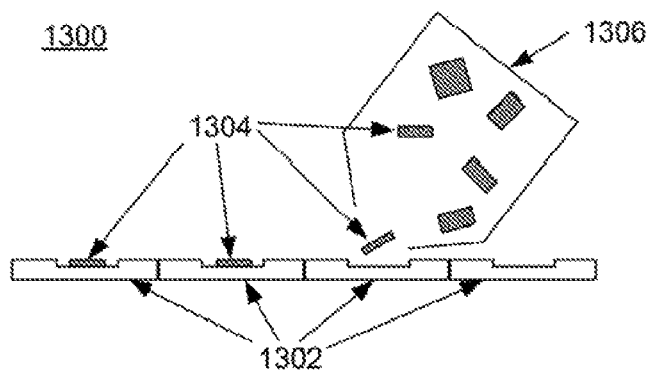
FIGS. 13A-C depict various methods for dispensing dual-sided ICs onto tag substrates according to embodiments.

FIG. 13A depicts a method for dispensing dual-sided ICs onto tag substrates (such as those described in FIGS. 12A-C) according to embodiments. Diagram 1300 depicts a bulk IC dispenser 1306 containing multiple dual-sided ICs 1304. Note that the orientation and positioning of the ICs 1304 within bulk dispenser 1306 does not need to be strictly controlled. In some embodiments, of course, the orientation of ICs 1304 may be controlled to some degree in order to streamline the dispensing process.

Bulk IC dispenser 1306 dispenses ICs 1304 onto a web of tag substrates 1302, which in some embodiments may be similar to tag substrates 1204, 1224, and 1244 in FIGS. 12A-C. In some embodiments, the dispensing process may also position the dispensed ICs into desired locations on the tag substrates 1302. For example, the IC dispenser 1306 may be positioned over a desired IC location (e.g., dimpled region 1206 in FIG. 12A, hole 1226 in FIG. 12B, or slot 1246 in FIG. 12C), and an IC 1304 is dispensed into a desired location by gravity (i.e., dropped) or placed by a machine.

Figure 13B:
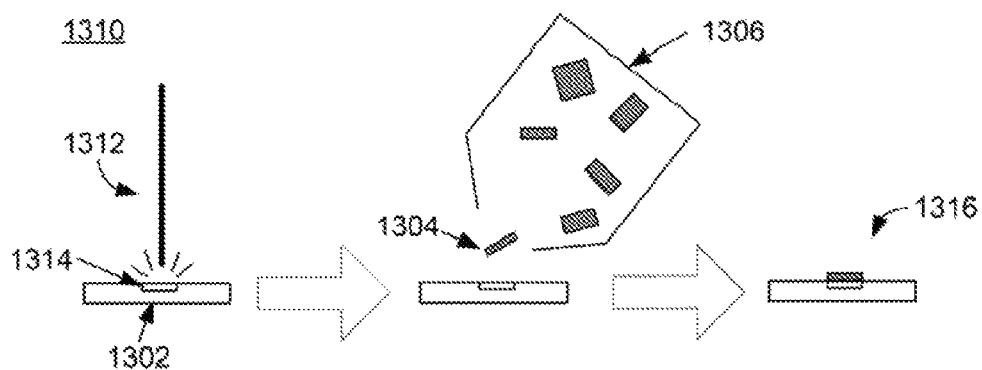

As will be obvious to those skilled in the art, there are many techniques for aligning dispensed ICs to their proper locations on a substrate, whether the substrate includes dimples/holes/slots as in FIGS. 12A-C or is planar as in FIGS. 10A-D or FIGS. 11A-C. One way, as described above, involves using gravity to place the ICs in their desired locations. Another way uses a magnet positioned below the tag substrate to attract magnetic ICs to their desired locations. Yet another way uses electric charge on the tag substrate to draw charged ICs to their desired locations. FIG. 13B depicts a representative method 1310 for using electric charge to position dual-sided ICs onto substrates according to embodiments. In method 1310, a laser 1312 induces charge of a particular polarity at a desired target location 1314 on substrate 1302. Subsequently, bulk IC dispenser 1306 dispenses ICs 1304 charged with a different polarity, which are attracted by the charged targets 1314 to their proper location on substrate 1302, shown schematically by inlay 1316. While a laser is used to induce charge in FIG. 13B, in other embodiments other methods may be used to generate charge on the substrate. In some embodiments topological features (e.g., bumps 906) may help position the ICs.

Other ways to align dispensed ICs to their proper locations on a substrate include using vibration or fluid flow to move an IC to a potential well (i.e., a substrate location with lower potential energy than other substrate locations), where the well can have low gravitational potential, electric potential, magnetic potential, or similar. For example, a tag substrate with an IC placed near a dimpled region or hole may be vibrated such that the IC moves into the dimpled region or hole but does not escape once there. Similarly, fluid or gas flow may convey a dispensed IC across a substrate until it falls into a recessed location (e.g., dimpled region 1206, hole 1226, or slot 1246 in FIGS. 12A-C, respectively). As another example, a fluid or gas that is drawn from the top side of the substrate to the back side through an aperture at the desired location (e.g., aperture(s) 1222 or 1232 in FIG. 12A or 12B, respectively) may draw an IC to the desired location and hold it there for subsequent processing.

Figure 13C:
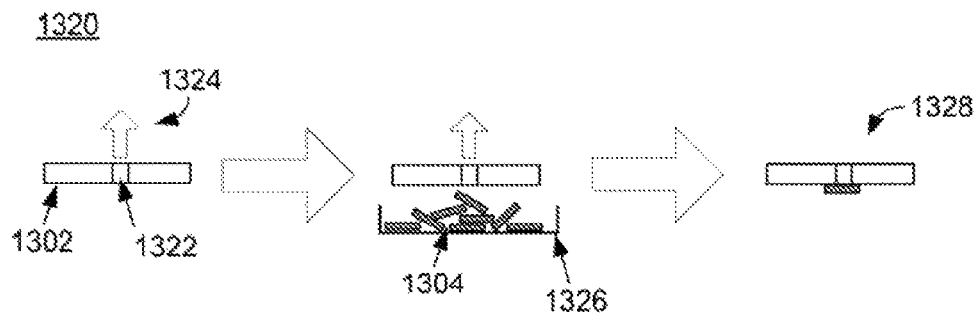

In some embodiments, applying a pressure differential between the two sides of a tag substrate will achieve the desired fluid/gas flow through apertures in the substrate. FIG. 13C depicts a method 1320 for using a pressure differential, specifically a vacuum, to position dual-sided ICs on tag substrates. In method 1320, vacuum 1324 is applied to the back side of substrate 1302 containing at least one through-substrate aperture 1322 (e.g., aperture(s) 1222 or 1232 in FIGS. 12A-B). Subsequently, when ICs 1304 are brought near the front side of substrate 1302 one of the loose ICs 1304 is pulled to the substrate by the vacuum 1324 acting through aperture 1322, resulting in inlay 1328. Method 1320 is self-limiting, because once vacuum 1324 pulls a single IC 1304 to the aperture 1322, aperture 1322 is then blocked by the IC 1304 and no further ICs will be drawn to that aperture. If the same vacuum source is used for multiple substrates and/or multiple apertures, then as each aperture attracts a blocking IC, the vacuum through the remaining apertures will become stronger, thus accelerating the placement process. In some embodiments, electrostatic or magnetic forces (e.g., as described above in FIG. 13B) or topological features (e.g., bumps 906) may also be used to help position the IC. Finally, in some embodiments the pressure differential may be applied from the front side of the tag substrate, where front-side pressure can be used to push ICs into position over apertures, rather than back-side vacuum pulling them into position.

In other embodiments, fluid surface tension can be used to position ICs on a substrate. For example, one or more drops of fluid may be placed at a desired location on the substrate. When the IC is dispensed onto the substrate, it may be drawn to the fluid droplets as a result of surface tension. In some embodiments, solder may be deposited on the substrate (e.g., via screen-printing) and then heated to form the fluid droplets. Solder may also (or instead) be deposited on one or more surfaces of the IC. When heated, the solder on the IC may melt to form droplets that are preferentially attracted to metallic antenna leads on a substrate.

Figure 14:
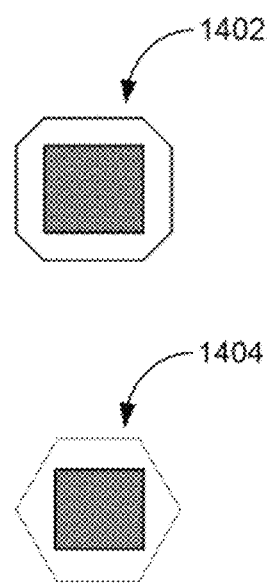
FIG. 14 depicts non-square dual-sided ICs according to embodiments.

Although all the dual-sided ICs depicted herein have been square, dual-sided ICs may have other shapes as well. FIG. 14 depicts two examples of non-square ICs. IC 1402 has an octagonal shape, and IC 1404 has a hexagonal shape. Non-rectangular ICs may benefit from less internal stress, resulting in improved reliability, and may also lack sharp corners that are susceptible to damage during bulk handling or the IC-dispensing methods described above. Non-rectangular ICs may be fabricated via, for example, etching processes such as those described in U.S. Pat. No. 7,482,251 issued on Jan. 27, 2009, the entirety of which has been incorporated by reference.

Figure 15A:
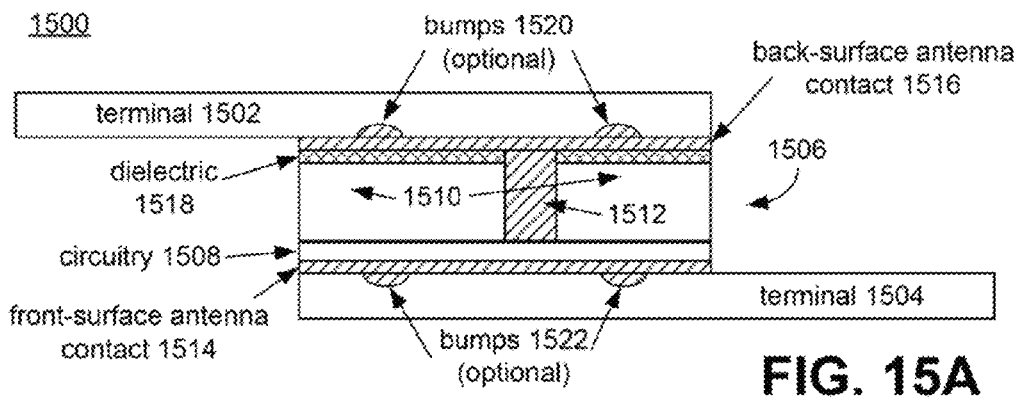
FIGS. 15A-C depict side cutaway views of dual-sided ICs contacting antenna terminals according to embodiments.
Figure 15B:
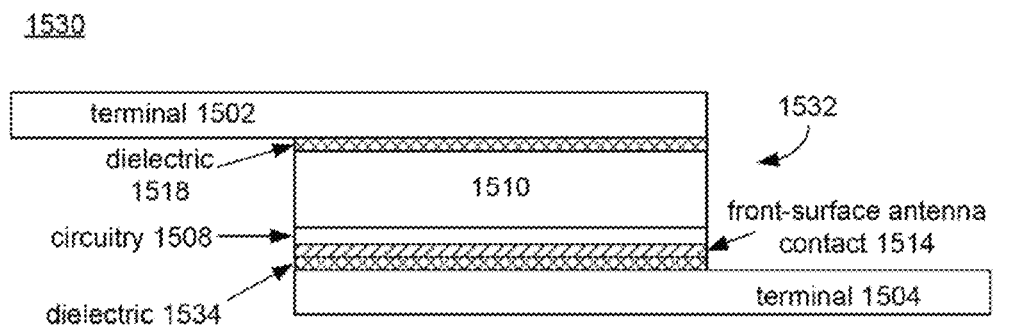
Figure 15C:
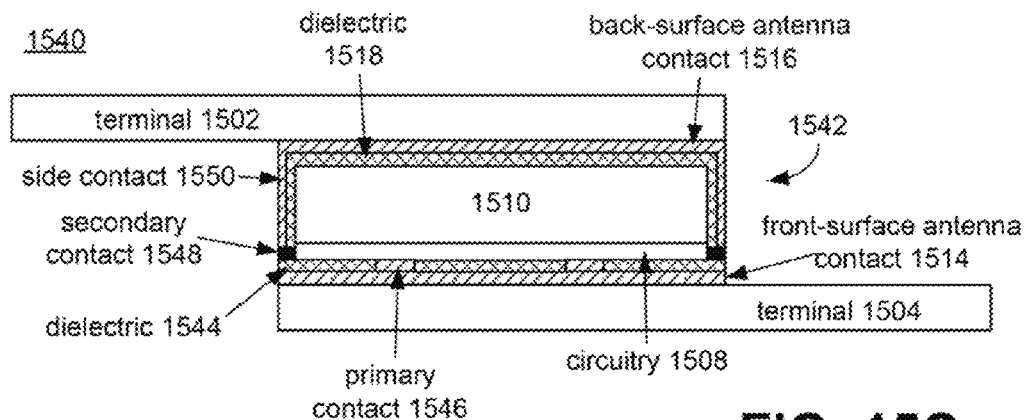

FIGS. 15A-C depict side cutaway views of dual-sided ICs electrically coupling to antenna terminals according to embodiments.

FIG. 15A depicts a side cutaway view 1500 of a dual-sided IC 1506 similar to dual-sided ICs 600, 706, 1006, 1106, 1202, and 1222 described above. Dual-sided IC 1506 includes circuitry 1508 disposed in or on its front surface (shown facing downward). Circuitry 1508 is electrically coupled to antenna terminal 1504 by means of its front-surface antenna contact 1514. Dual-sided IC 1506 also includes a back-surface antenna contact 1516 that may couple to circuitry 1508 by a number of methods—FIG. 15A shows one method which involves a through-IC via. In some embodiments the through-IC via may be electrically connected to substrate 1510; in other embodiments it may be electrically disconnected from substrate 1510; in yet other embodiments it may not be present at all. In the embodiment of FIG. 15A back-surface antenna contact 1516, which couples to antenna terminal 1502, is shown electrically disconnected from substrate 1510 by an optional dielectric layer 1518. Of course, back-surface antenna contact 1516 may be electrically connected to substrate 1510 as well. In some embodiments, optional bumps 1520 and/or 1522 may improve the coupling between the antenna contacts and the antenna terminals.

FIG. 15B depicts a side cutaway view 1530 of a dual-sided IC 1532 similar to IC 1506 in FIG. 15A. Like IC 1506, IC 1532 includes circuitry 1508 disposed in or on its front surface that is electrically coupled to terminal 1504 by means of a front-surface antenna contact 1514. Unlike FIG. 15A, IC 1532 does not include a through-IC via; instead, circuitry 1508 couples to terminal 1502 through substrate 1510. When IC 1532 receives an RF signal across front-surface antenna contact 1514 and back-surface antenna contact 1516, the electrical potential difference across IC 1532 causes current to flow from front-surface antenna contact 1514 to back-surface antenna contact 1516 through substrate 1510, and/or vice-versa. Substrate 1510 is typically conductive, but in some circumstances it may be insulating and the current flow from front to back surface may be through the capacitance of insulating substrate 1510. In other embodiments substrate 1510 may exhibit an inductance. In FIG. 15B, substrate 1510 forms the back-surface antenna contact; in other embodiments the back surface may include a metallic or semi-metallic layer (as in FIG. 8) or may be doped to have a high electrical conductivity. FIG. 15B also shows an optional dielectric layer 1518 separating the back surface of IC 1532 from terminal 1502, so the coupling between them is capacitive, but of course a galvanic coupling is possible as well. Dielectric 1518 may be deposited on substrate 1510 or may be a naturally occurring oxide of substrate 1510 such as $SiO_2$. Similarly, front-surface antenna contact 1514 may capacitively couple with terminal 1504 through an optional dielectric layer 1534 or it may galvanically couple. The ordering of dielectric layer 1534 and front-surface antenna contact 1514 may be swapped, so that dielectric layer 1534 is disposed on circuitry 1508 and front-surface antenna contact 1514 is disposed between dielectric layer 1534 and terminal 1504.

FIG. 15C depicts a side cutaway view 1540 of a dual-sided IC 1542 similar to IC 1532 in FIG. 15B. Like with IC 1532, IC 1542 includes circuitry 1508 disposed in or on its front surface, an optional front-surface dielectric layer 1544, a front-surface antenna contact 1514, a galvanically or capacitively coupled substrate 1510, an optional back-surface dielectric layer 1518 and a back-surface antenna contact 1516. Unlike FIG. 15B, circuitry 1508 couples to front-surface antenna contact 1514 by means of one or more primary contacts 1546 through dielectric layer 1544. Also unlike FIG. 15B, dielectric layer 1518 may be present on one or more side surfaces of IC 1542. Back-surface antenna contact 1516 may couple to a side contact 1550 that spans at least one side of IC 1542 and couples with circuitry 1508 by means of secondary contacts 1548 through dielectric layer 1518. Essentially, side contact 1550 forms a conductive or galvanic path from circuitry 1508 to back-surface contact 1518 that is an alternative to the through-IC via in FIG. 15A. In some embodiments circuitry 1508 may couple capacitively with side contact 1550 rather than through secondary contacts 1548. In other embodiments dielectric 1544 does not cover one or more of the front, side, or back surfaces of IC 1542.

Dielectric layer 1518 may be a native oxide that forms on substrate 1510 or may be deposited on IC 1542. The oxide formation or deposition may occur at any time. Similarly, side contact 1550 may be a region of substrate 1510 doped for a conductivity that is higher than that of the native substrate 1510 or may be deposited on substrate 1510. The doping or deposition may occur at any time.

Figure 16A:
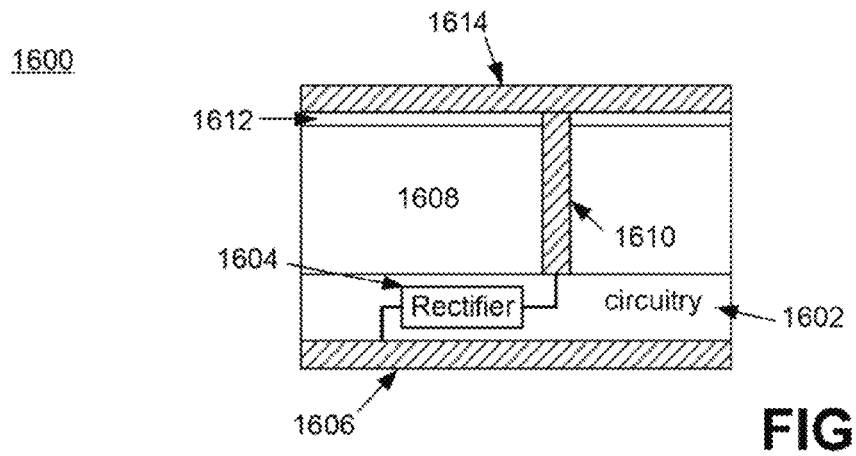
FIGS. 16A-C depict side cutaway views of rectifiers in a dual-sided IC electrically coupled to antenna contacts on different surfaces of the IC according to embodiments.
Figure 16B:
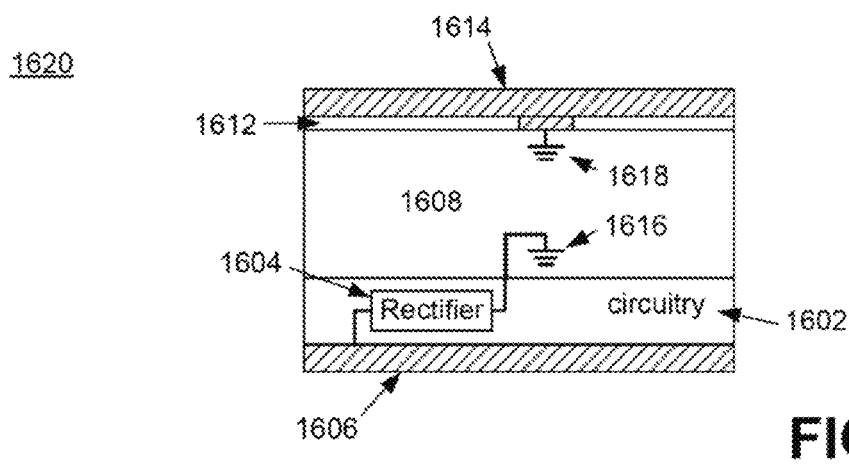
Figure 16C:
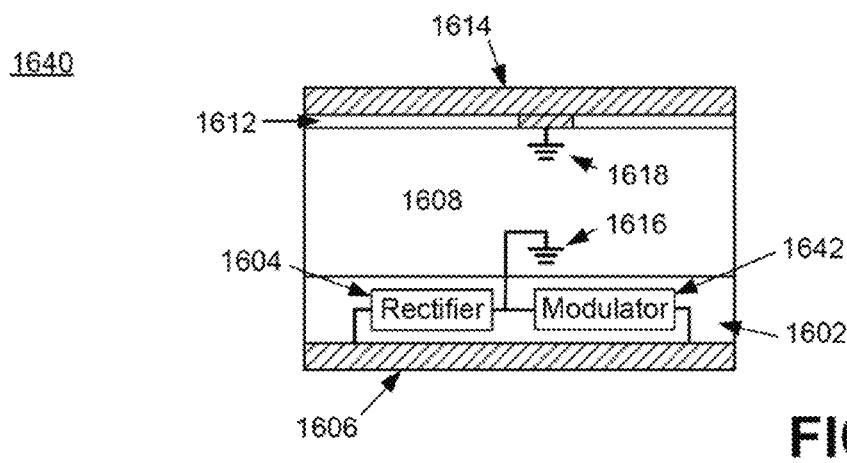

FIGS. 16A-C depict side cutaway views of dual-sided ICs with at least one circuit element electrically coupled to contacts on at least two surfaces of the IC according to embodiments. FIG. 16 shows the circuit element as a rectifier, but the element could be any circuit component such as those described in reference to FIG. 4. In some embodiments the rectifier may be a charge pump—this disclosure uses the terms "rectifier" and "charge pump" interchangeably. Rectifiers as described herein couple to antennas, so in a dual-sided ICs they couple to the two antenna contacts on different surfaces of the IC. FIG. 16A depicts a dual-sided IC 1600 similar to dual-sided ICs 1506/described in reference to FIG. 15. Dual-sided IC 1600 includes, as part of circuitry 1602, a rectifier 1604 that is electrically coupled to front-surface antenna contact 1606 and to back-surface antenna contact 1614 by a through-IC via 1610. Like for IC 1506, a dielectric layer 1612 may optionally separate back-surface antenna contact 1614 from IC substrate 1608.

FIG. 16B depicts another dual-sided IC 1620, similar to dual-sided IC 1600 described in reference to FIG. 16A. The difference in FIG. 16B is that rectifier 1604 couples with back-surface antenna contact 1614 by means of substrate 1608 instead of by a through-IC via, shown schematically by back-surface antenna contact 1614 and rectifier terminal 1616 being grounded (i.e. back-surface antenna contact 1614 and rectifier terminal 1616 are electrically coupled through a conductive substrate at a common potential). Of course, the reference to ground as used herein means only a common potential and need not convey any connection with earth ground. In some embodiments the substrate may be made conductive by doping; in other embodiments circuitry 1602 may be fabricated on an epitaxial layer of substrate 1608 that is either electrically connected to or disconnected from conductive substrate 1608. In the latter case rectifier terminal 1616 may couple to substrate 1608 capacitively.

FIG. 16C depicts another dual-sided IC 1640, similar to dual-sided IC 1620 described in reference to FIG. 16B. In IC 1640, circuitry 1602 also includes a modulator 1642 that is electrically coupled to front-surface antenna contact 1606 and back-surface antenna contact 1614. Modulator 1642 couples with back-surface antenna contact 1614 through substrate 1608, similar to rectifier 1604. When IC 1640 responds by backscattering (as described above in reference to FIG. 2), modulator 1642 may modulate the impedance (or admittance) between front-surface antenna contact 1606 and back-surface antenna contact 1614 in order to modify the current flowing through substrate 1608 (as described above in relation to FIG. 15B) and thereby generate the response. The total impedance between the two surface antenna contacts depends on the impedance of rectifier 1604, modulator 1642, and substrate 1608. By modulating its own impedance based on a desired reply signal, modulator 1642 alters the total impedance between the two surface antenna contacts and thereby modulates the currents flowing through substrate 1608. As a specific but not-limiting example, modulator 1642 may electrically connect and disconnect (via switching action) the two surface antenna contacts to generate the response signal.

FIGS. 16A, 16B, and 16C should not be construed as limiting the types or elements of circuitry 1602 that may couple across multiple surfaces of a dual-sided IC. As will be described below, other circuits that may similarly couple include modulators, PMUs, antenna-routing nodes, impedance matching circuits, ESD circuits, and indeed any circuitry present in an RFID IC.

In some embodiments dielectric 1518/1534/1544 may be or may include a nonconductive stabilization layer. The stabilization layer may aid in mitigating mounting capacitance variations due to varying mounting forces.

Diagram 1700 shows an RFID strap or inlay comprising substrate 1720 and antenna terminal 1727 being pressed against RFID IC 1724 with a mounting force F (1702), where antenna terminal 1727 and antenna contact 1712 are separated from the IC by stabilization layer 1710. Mounting distance D1 (1704) is fixed by stabilization layer 1710, producing a similarly fixed mounting capacitance C1.

Diagram 1750 shows the RFID strap or inlay being pressed against the RFID IC with a mounting force F2 (1752) which is larger than mounting force F1. The presence of stabilization layer 1710 ensures that mounting distance D2 (1754) is substantially the same as mounting distance D1 (1704) despite the larger mounting force F2. As a result, mounting capacitance C2 is substantially similar to mounting capacitance C1, helping ensure that the tags have similar tuning and therefore similar performance characteristics.

In some embodiments, bumps formed through openings in stabilization layer 1710 electrically connect circuits 1762 to antenna contact 1712. Stabilization layer 1710 may be an organic or inorganic material, typically (although not necessarily) with a relatively low dielectric constant and a reasonable thickness to provide small capacitance. An anisotropic conductive adhesive, patterned conductive adhesive, or nonconductive adhesive 1713 may optionally be applied between the IC and the strap/inlay to attach the IC to the strap/inlay, either or both physically and electrically. If adhesive layer 1713 is nonconductive then it is typically sufficiently thin that at the frequencies of RFID communications it provides a low-impedance capacitive path between antenna terminal 1727 and antenna contact 1712.

Figure 17:
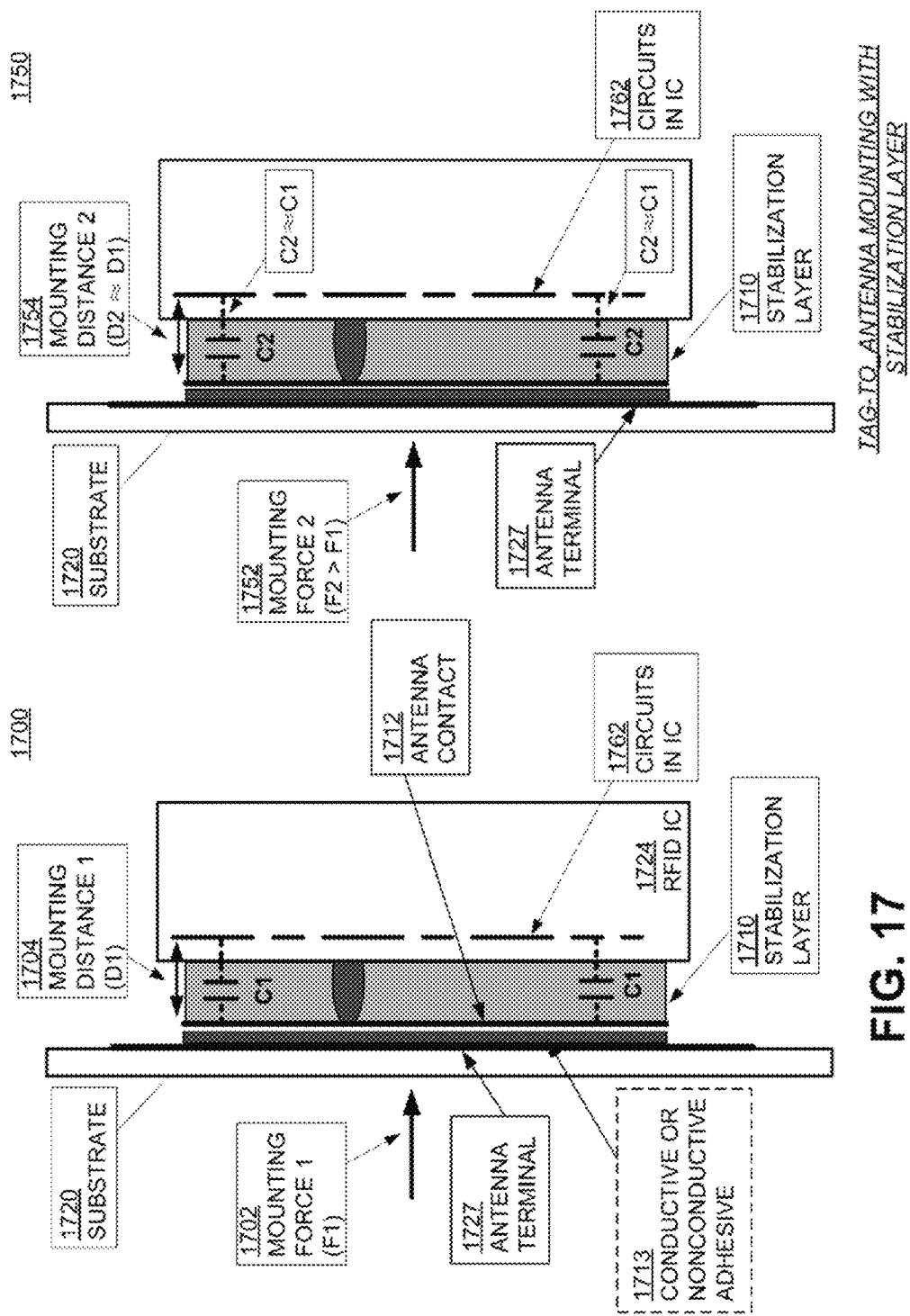
FIG. 17 depict stabilization layers used to reduce capacitance variations between dual-sided ICs and antenna terminals according to embodiments.

In some embodiments antenna contact 1712, similar to contact pads 804 or 806 in FIG. 8, substantially covers the surface of RFID IC 1724. For reasons of clarity, FIG. 17 does not show the back-surface antenna contact such as contact 1614 in FIG. 16. It should be apparent that this back-surface antenna contact may be formed with or without a stabilization layer, independent or whether the IC front surface includes a stabilization layer, and that this back surface stabilization layer can be or can include the dielectric layer 1612 in FIG. 16.

Figure 18A:
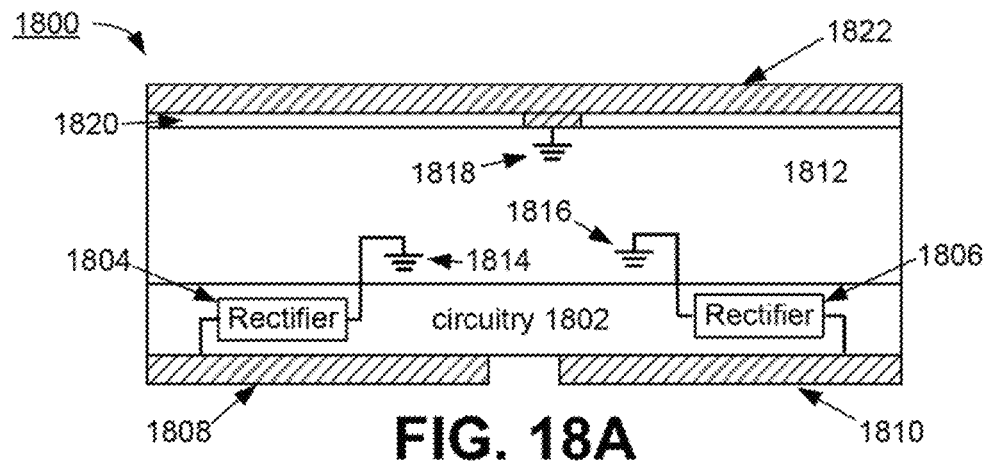
FIGS. 18A-C depict side cutaway views of rectifiers in a dual-differential dual-sided IC coupling to contacts on different surfaces of the IC.
Figure 18B:
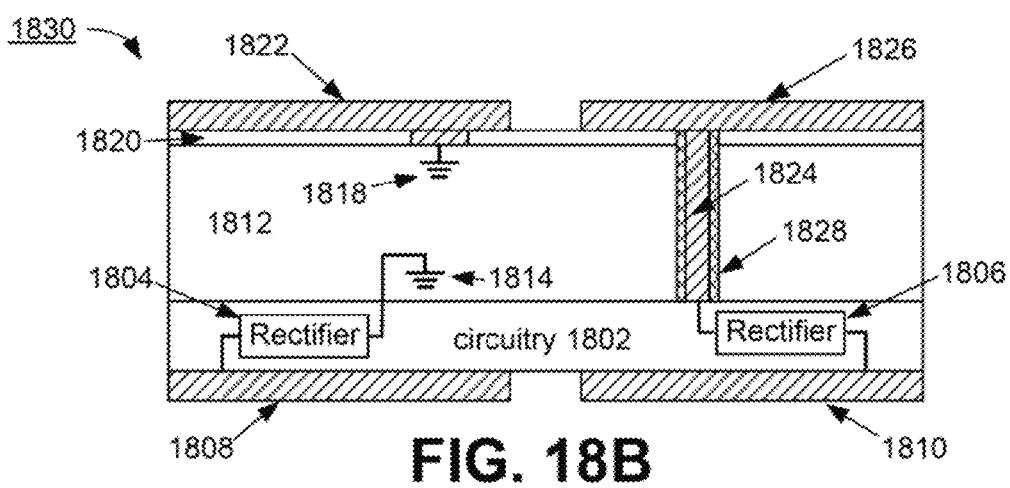
Figure 18C:
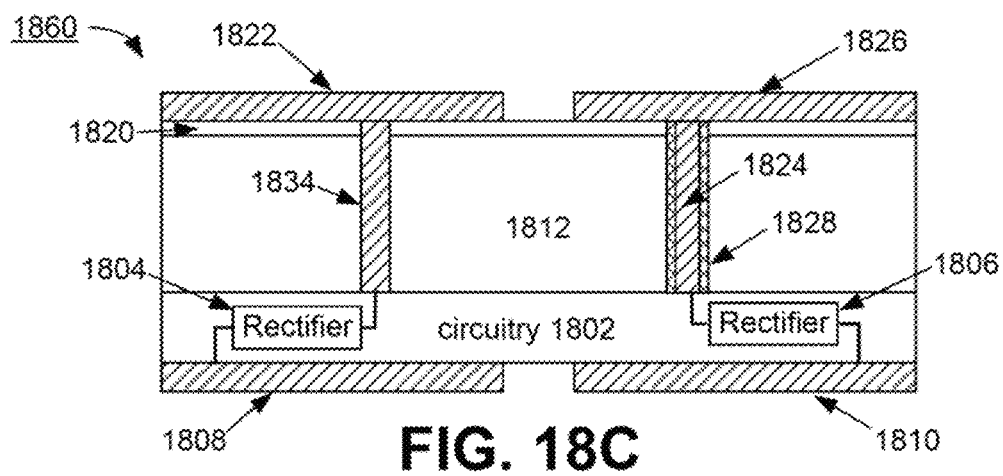

FIGS. 18A-C depict side cutaway views of rectifiers in dual-differential dual-sided ICs coupling to contacts on multiple surfaces of the IC. Dual-differential RFID ICs contain two or more electrically isolated antenna ports, in which an odd-mode excitation on one antenna port produces essentially no excitation on another antenna port.

Dual-differential ICs typically include multiple rectifiers, each electrically coupled to a different antenna port. FIG. 18A depicts a first dual-differential dual-sided IC 1800 including circuitry 1802 having a first rectifier 1804 and a second rectifier 1806. First rectifier 1804 is electrically coupled to a first front-surface antenna contact 1808, and second rectifier 1806 is electrically coupled to a second front-surface antenna contact 1810. Both rectifiers couple to a back-surface antenna contact 1822 through substrate 1812, similar to dual-sided IC 1620 described in FIG. 16B. Like with FIG. 16B, the reference to ground means only a common potential and need not convey any connection with earth ground.

FIG. 18B depicts a second dual-differential dual-sided IC 1830 including circuitry 1802 having a first rectifier 1804 and a second rectifier 1806. IC 1830 is similar to IC 1800 described in reference to FIG. 18A, but IC 1830 includes two back-surface contacts with first rectifier 1804 coupling to back-surface antenna contact 1822 by means of substrate 1812 and second rectifier 1806 coupling to back-surface antenna contact 1826 by a through-die via 1824 which is typically electrically disconnected from substrate 1812 by a dielectric layer 1828.

FIG. 18C depicts a third dual-differential dual-sided IC 1860 including circuitry 1802 having a first rectifier 1804 and a second rectifier 1806. IC 1860 is similar to IC 1830 described in reference to FIG. 18B, but IC 1860 includes two through-IC vias with first rectifier 1804 coupling to back-surface antenna contact 1822 by through-die via 1834 and second rectifier 1806 coupling to back-surface antenna contact 1826 by through-die via 1824. Typically at least one, and often both, of these through-IC vias are electrically disconnected from substrate 1812 by a dielectric layer 1828.

Figure 19A:
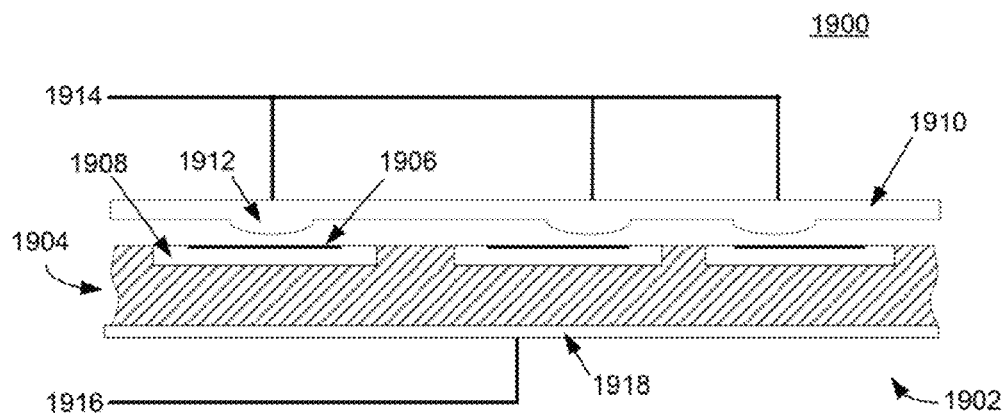
FIGS. 19A-B depict conceptual diagrams of dual-sided IC wafer test systems.
Figure 19B:
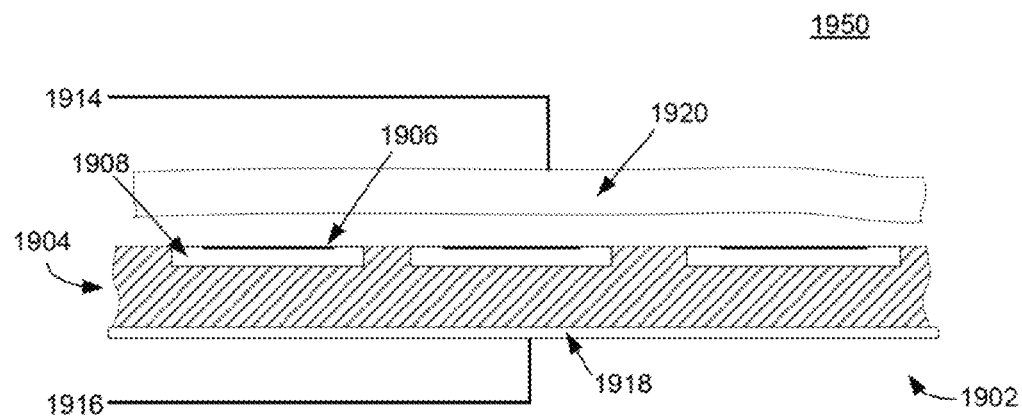

Dual-sided ICs may enable other applications in addition to facilitating antenna pad alignment to antenna terminals. As one example, dual-sided ICs on a semiconductor wafer may facilitate wafer-scale testing. FIGS. 19A-B depict conceptual diagrams of a dual-sided IC wafer test system according to embodiments.

FIG. 19A depicts a wafer test system 1900 for testing a dual-sided IC wafer 1902 which includes one or more dual-sided ICs as described above. The cross-sectional portion of wafer 1902 depicts three dual-sided ICs, only one of which is labeled (IC 1908). IC 1908 includes IC circuitry (not shown) coupled to a front-surface contact 1906 and to a back-surface contact 1918 through one of the means described above (e.g., a through-wafer via, substrate coupling, etc.). A probe card 1910 couples test bus 1914 to multiple probe contacts 1912 which are often, but not necessarily, electrically disconnected from each other (in RFID systems, where RFID ICs contain singulation algorithms, the probe contacts 1912 need not be disconnected at all). A second test lead 1916 is electrically coupled to back-surface contact 1920 which in FIG. 19A spans multiple die (and in some embodiments may span the entire wafer). During wafer testing, probe card 1910 is positioned such that each probe contact 1912 couples galvanically or capacitively to an IC front-surface contact (e.g., front-surface contact 1906). By providing a test signal to test bus 1914 and test lead 1916, multiple dual-sided ICs on the wafer 1902 may be simultaneously tested. As suggested by FIG. 19A, the large size of the front-side IC contacts and the fact that the second test lead couples to back-surface contact 1918 reduces the alignment tolerances required by probe-card 1910.

FIG. 19B depicts another wafer test system 1950 for testing a dual-sided IC wafer 1902. Instead of a probe card with individual probe contacts that couple to the IC front-surface contacts, test-system 1950 uses a flexible, conductive contact layer 1920 to perform the coupling. Because the entire contact layer 1920 is conductive, wafer test system 1950 eliminates the alignment requirements for probe-to-IC-contact. Flexible contact layer 1920 may be a flexible and/or conformable material that is electrically conductive, such as a conductive rubber or polymer. To couple flexible contact layer 1920 to the IC front-surface contacts, a force or pressure (such as might be applied by a gas, fluid, or other means) may be applied to the back of contact layer 1920 and/or to the back of wafer 1902. Alternatively, a high-dielectric-constant or conductive gas or fluid may be placed between flexible contact layer 1920 and wafer 1904 to facilitate capacitive or galvanic coupling, respectively, between them.

In some embodiments back-surface contact 1918 may include a conductive metallic or semi-metallic layer such metal, polysilicon, and/or a doped layer that allows second test lead 1916 to make a galvanic connection. In other embodiments back-surface contact 1918 may include a dielectric or insulating layer that allows second test lead 1916 to make a capacitive connection.

Dual-sided ICs as described herein may implement any functionality available to a single-sided IC, but with the many advantages and benefits described in this document. Although some of these functionalities are described below, it should be apparent to one skilled in the art that dual-sided ICs may implement functionalities not explicitly described herein.

Figure 20:
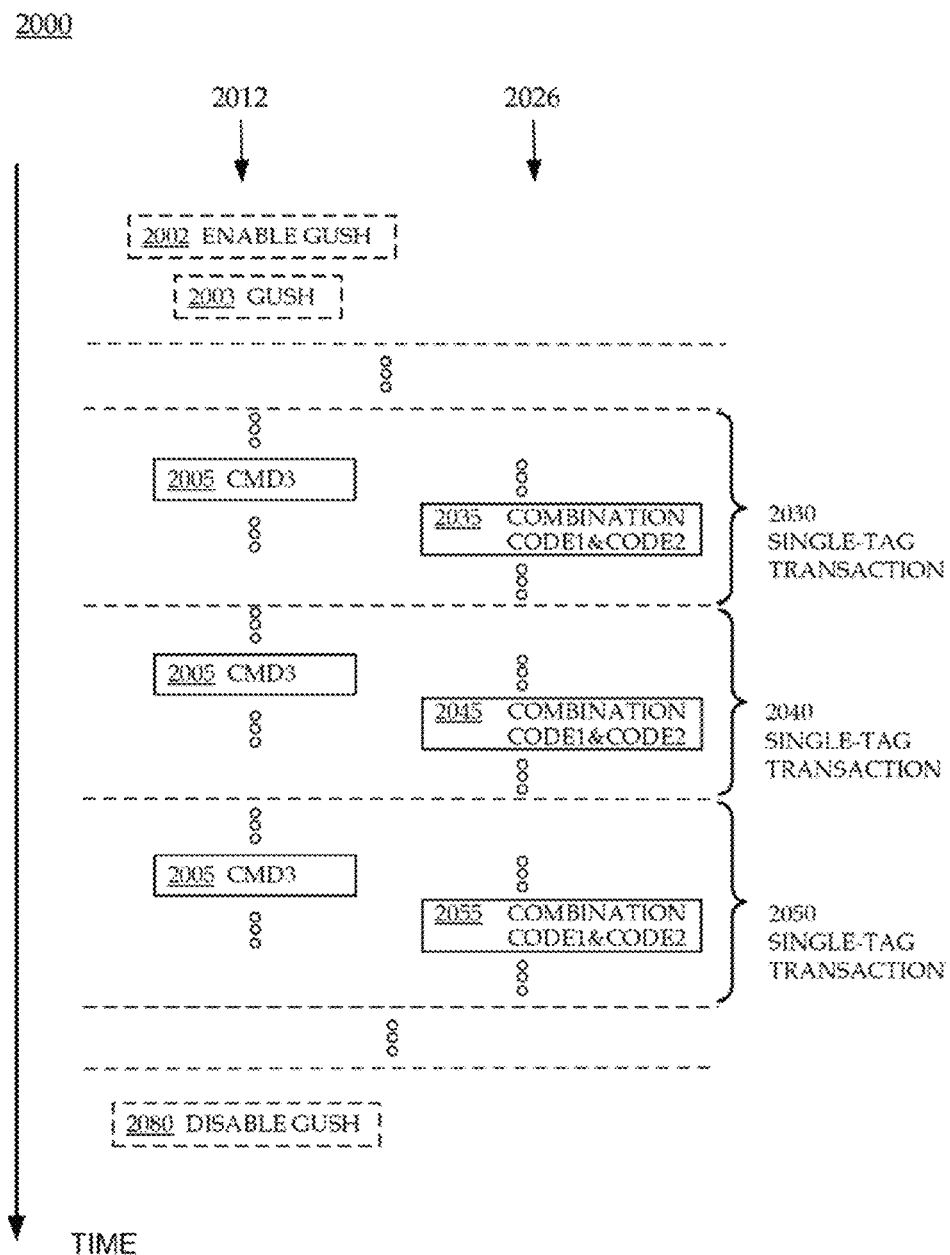
FIG. 20 is a timing diagram showing commands from an RFID reader and responses from a population of RFID tags for reading combinations of first and second codes of the tags according to embodiments.

In some embodiments, a dual-sided IC may be configured to backscatter a combination of codes, as described in U.S. Pat. No. 8,174,367 issued on May 8, 2012, which has been incorporated by reference. FIG. 20 is a timing diagram 2000 showing commands from an RFID reader and replies by a population of RFID tags according to embodiments. Neither the reader nor the tags are shown in diagram 2000. In some embodiments, the tags may store a first code and a second code. The commands in diagram 2000 cause tags to "gush" a reply comprising combinations of first and second codes, without any intervening reader commands between them, according to embodiments.

Timing diagram 2000 proceeds downward along a vertical axis TIME, with commands 2012 transmitted by the reader alternating with replies 2026 from the tags. In the example of diagram 2000, the reader first instructs the tags to gush their replies by means of one or more of an optional ENABLE GUSH command 2002 and a GUSH command 2003. During the time each tag is singulated the reader has a transaction with the singulated tag and receives tag data. Three example transactions 2030, 2040, 2050 are described, but more or less such transactions may take place. Each transaction 2030, 2040, 2050 is not necessarily described in full, but only some pertinent commands are given. Not shown are commands, for example, to singulate each tag for its transaction. Finally, an optional DISABLE GUSH command may terminate the gushing behavior.

In first transaction 2030 with a first singulated tag, command CMD3 2005 causes the first tag to send a reply comprising a combination 2035 of at least a portion of code1 and at least a portion of code2 from tag memory, without the tag receiving a reader command in-between sending the two code portions. In transaction 2040 with a second singulated tag, a repeated command CMD3 2005 elicits a combination 2045 from the second tag, again with no intervening command. Then in transaction 2050 with a third singulated tag, a repeated command CMD3 2005 elicits a combination 2055 from the third tag, again with no intervening command.

In some embodiments transactions 2030, 2040, and 2050 may take less time than transactions that involve sending the first and second codes separately, with an intervening reader command in between.

In some embodiments, a dual-sided IC may be configured with a tuning circuit to match antenna and IC impedances for facilitating power extraction from an incident RF wave. FIG. 21A illustrates an RFID tag front-end equivalent circuit 2100 including a tuning circuit and a memory for storing tuning data, according to one embodiment. The RFID tag front-end equivalent circuit 2100 models the various impedances of an RFID tag and includes an antenna section 2108, an IC input section 2110, and a matching network that couples the antenna section 2108 to the IC input section 2110. The antenna section 2108 includes inductor 2104 and capacitor 2106, which model the reactive portion of the antenna impedance, and resistor 2102, which models the real portion of the antenna impedance. The IC input section 2110 includes a resistor 2112 that models the input resistance of the IC, and a capacitor 2114 that models the input reactance of the IC. The matching network includes an inductor 2116 that models the inductance of the matching network.

The equivalent circuit 2100 also includes a tuning circuit 2120 electrically coupled to a variable impedance element 2122. The tuning circuit 2120 may include an optional nonvolatile memory (NVM) 2124 electrically coupled to a processing block 2126. NVM 2124, which is configured to store and maintain data even in the absence of power, may include one or more of ROM, EEPROM, flash, MRAM, FRAM, fuses, or other memory types known in the art for storing data, and may be one-time-programmable or may be able to be written to and/or erased repeatedly. NVM 2124 stores information about the tag tuning, such as settings for variable impedance element 2122. These settings may be preprogrammed into the NVM before or after the RFID IC is integrated into an RFID tag.

In some embodiments the settings stored in NVM 2124 may be dynamically adjusted. For example, in the course of a tag-tuning process (e.g., process 2200 described below in relation to FIG. 22) the stored variable-impedance settings may be overwritten or supplemented by new settings that provide better impedance matching.

NVM 2124 may also store data about the power extracted and/or reflected by the tag. For example, NVM 2124 may store previous values of extracted and/or reflected power for use in an iterative tag-tuning process, where successively detected values of extracted/reflected power are used to evaluate the effect of variable-impedance adjustments.

In some embodiments NVM 2124 is not required, in which case processing block 2126 may use or cycle through preset or algorithmically determined values for variable impedance element 2122 to improve the power extraction.

Processing block 2126 is typically configured to adjust variable impedance element 2122 to increase the amount of power that IC 424 extracts from an RF wave incident on the tag antenna. Processing block 2126 may adjust variable impedance element 2122 based on impedance settings stored in NVM 2124, based on previous extracted/reflected power data stored in NVM 2124, and/or based on one or more impedance-adjustment algorithms.

Processing block 2126 may also update or overwrite the stored impedance settings if new settings provide more extracted RF power. In some embodiments processing block 2126 may adjust the impedance upon command from an external entity (e.g., an RFID reader). In other embodiments processing block 2126 may also (or instead) adjust the impedance based on one or more environmental conditions.

FIG. 21B illustrates another RFID tag front-end equivalent circuit 2150 including a tuning circuit 2120, according to embodiments. In circuit 2150, tuning circuit 2120 may be configured to determine an amount of extracted power and to adjust variable impedance element 2122 based on the amount. In one embodiment, a power detector 2152, which may be integrated into tuning circuit 2120 or into another circuit in IC 424 (e.g., in a rectifier or PMU), detects the amount of RF power extracted by the IC from the tag antenna (e.g. tag antenna 227 in FIG. 2). In one example, power detector 2152 may simply be the supply voltage developed by IC 424 from the RF wave incident on the tag antenna.

A tuning controller 2156 may adjust variable impedance element 2122 to improve the impedance match and thereby increase the extracted power. A comparator 2154 determines whether the extracted power is increasing or decreasing as the tuning controller adjusts the variable impedance element, thereby allowing the tuning controller to determine how to alter the impedance value to improve power transfer.

In some embodiments, the tuning circuit 2120 may be configured to operate at lower extracted power levels than IC 424. In some embodiments, a rectifier or PMU may disable IC 424 until the tuning circuit has maximized the extracted power and/or the amount of extracted power is sufficient to operate IC 424.

Figure 22:
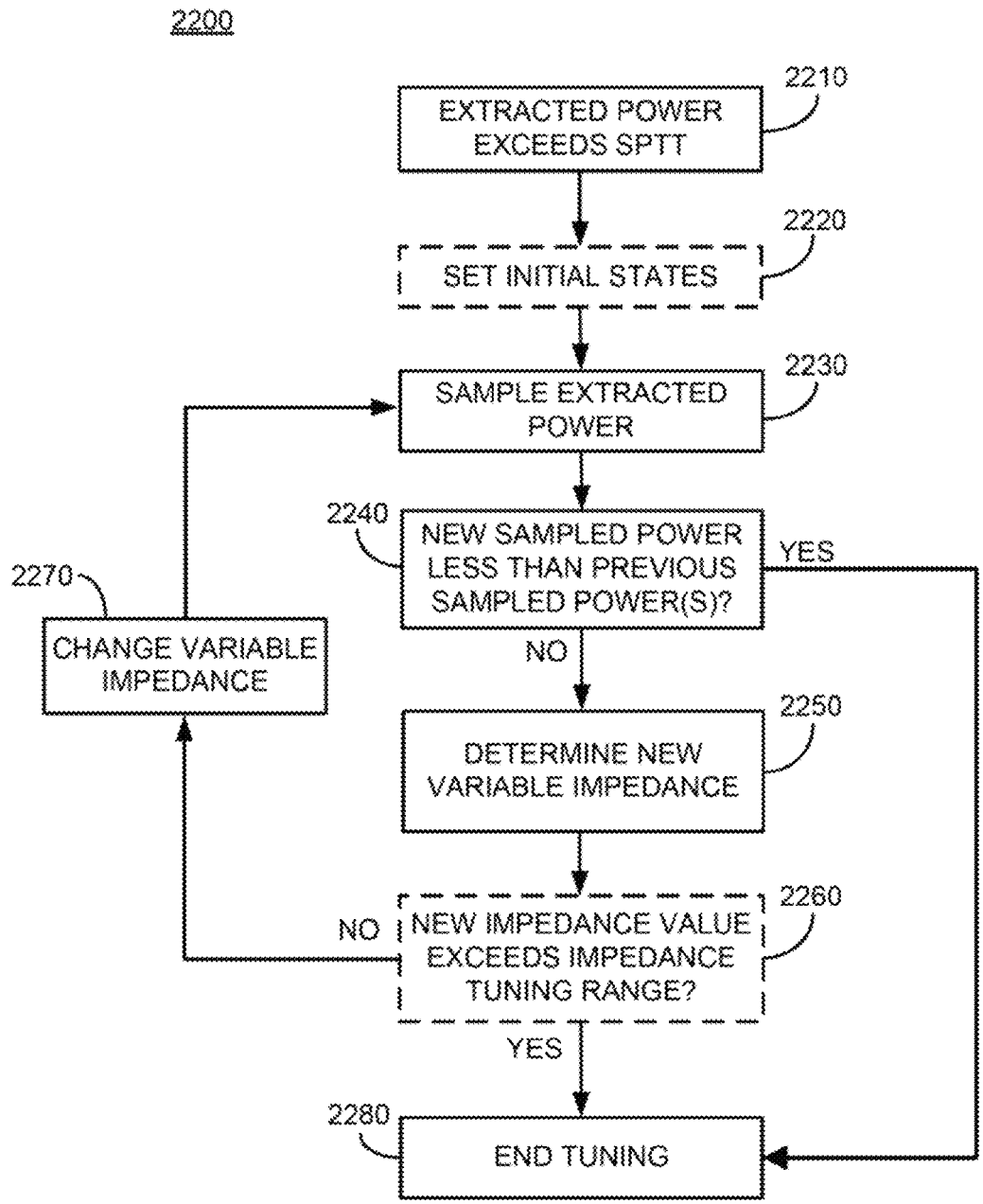
FIG. 22 is a flowchart for an RFID tag tuning process according to embodiments.

FIG. 22 is a flowchart for an RFID tag tuning process 2200 according to embodiments. Tuning process 2200 begins with step 2210, where an RFID tag with an antenna, an IC, a variable impedance element, and a tuning circuit extracts power from an incident RF wave at a level exceeding a "sufficient power to tune" (SPTT) parameter. In some instances the extracted power will be less than a "sufficient power to operate IC" (SPOI) parameter, in which case the tag IC will not have sufficient power to operate according to a protocol. However, tuning circuit 2120 does operate, because the extracted power is greater than the SPTT. In optional step 2220, the variable impedance element resets to an initial state. In some instances tuning circuit 2120 may set the initial state via a tuning algorithm, or retrieve the initial state from a memory (e.g., NVM 2124 in FIG. 21A) and apply it to the variable impedance element, or may use the variable impedance element's previous state as the initial state. In other instances the variable impedance element will set or reset itself to the initial state.

In step 2230, the tuning circuit samples the power extracted by the RFID tag, either to determine a baseline value (at the beginning of the tuning process) or to evaluate the effect of an impedance change (during the tuning process). If the latter then the tuning circuit in step 2240 determines if the newly sampled power value is less than one or more previously sampled power values. If not then the tuning continues. If so then the tuning circuit may assume that the power transfer and extraction has been maximized, and the process then moves to step 2280 where the tuning circuit halts the adjustment process. In some embodiments the criterion for determining whether the impedance value has been optimized may be complex, especially in cases where the relationship between the variable impedance element and the extracted power is not monotonic. In such circumstances the tuning circuit may use a search algorithm (in some cases including techniques available to those versed in computer science and/or machine learning) to determine if the power transfer can be improved further, even if the newly sampled power value is less than prior samples.

If the newly sampled power value exceeds the previously sampled value(s) or if the tuning circuit determines that power transfer can be further improved then the tuning circuit determines a new variable impedance value in step 2250. The tuning circuit may determine the impedance value in a variety of ways, such as using fixed steps, binary tree-traversal, proportional to the prior improvement, or using another algorithm as will be well known to those skilled in the engineering discipline. The new impedance value will, in general, be based on the most recent sampled power value (and in some embodiments, multiple previous power samples). In step 2260 the tuning circuit may optionally check if the new impedance value exceeds the tuning range of the variable impedance range. If so then the tuning circuit may halt the tuning process at step 2280.

If the new impedance value does not exceed the variable-impedance tuning range then the tuning circuit adjusts the variable impedance element in step 2270. The tuning process then loops back to step 2230, where a new sample of the extracted power is taken to evaluate the effect of the newly adjusted impedance. The tuning process 2200 iterates through steps 2230-2270 until the extracted power in step 2240 reaches either a sufficient value or a maximum (implying the impedance match is optimized) or until further impedance adjustments would exceed the tuning range of the variable impedance element (i.e. step 2260).

At the conclusion of tuning process 2200, in step 2280, the final variable impedance settings may be stored in a tag memory (e.g., in NVM 2124 in FIG. 21A). In some embodiments an RFID reader may be able to read the final impedance settings from the memory or instruct the tag IC to send them to the reader.

In some embodiments, both the extracted power and the reflected power may be sampled in step 2230 and used in the determination of step 2240. In these embodiments, increases in extracted power coupled with decreases in reflected power correspond to improved power transfer. The additional information provided by the reflected power may be useful, for example, in cases where the RFID tag is moving with respect to the RF power source and therefore the incident power is changing. By itself, an increase in extracted power after an impedance adjustment may result from a tag moving closer to a power source and not from better power transfer. However, by measuring both extracted and reflected power the tuning circuit can determine if the increase in extracted power is due to tag motion or to the impedance adjustment.

Figure 23:
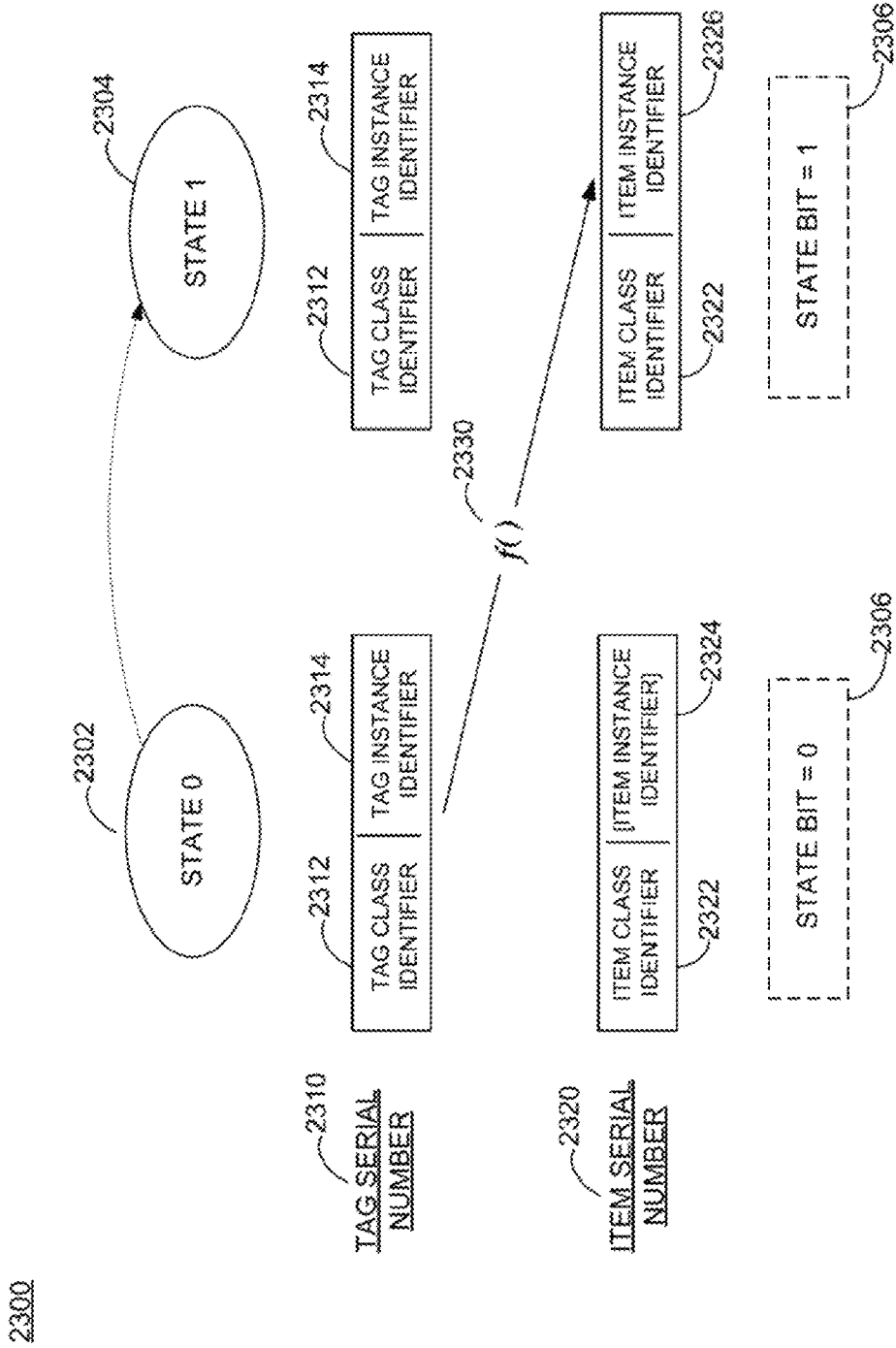
FIG. 23 is a diagram of RFID tag IC states before and after self-serialization according to embodiments.

In some embodiments, a dual-sided IC may be configured to self-generate a portion of an identifier in response to a reader signal. FIG. 23 is a diagram 2300 of RFID tag states before and after a self-serialization process according to embodiments. An RFID tag attached to an item may store in volatile or nonvolatile memory a tag serial number (TSN) 2310 and an item serial number (ISN) 2320. The TSN 2310 is a number that may be unique, may be used to identify the tag IC, and may be written into IC memory during IC manufacturing.

Each tag IC in an operating environment preferably has a different TSN 2310 so that individual tag ICs can be differentiated from each other. The ISN 2320 is a number stored on the tag that identifies the item to which the tag is attached. ISN 2320 may be written at or around the time that the tag is associated with its host item. Each item in an operating environment preferably has a different ISN 2320 so that individual items can be differentiated from each other. As one example, TSN 2310 may include a tag identifier (TID) and ISN 2320 may include an electronic product code (EPC), a universal product code (UPC), or a stock-keeping unit (SKU) number.

The TSN 2310 may be subdivided into at least a tag class identifier (TCI) 2312, which may denote the IC class or type and may be common to multiple ICs, and a tag instance identifier (TII) 2314 which is typically unique (at least for a period of time) and identifies a particular IC in the IC class by its serialization. In some instances, for example ones in which tags with different TCIs are not mixed, TCI 2312 may be null. In other instances each IC class, make, or model may have a different TCI 2312, and all tags of that class, make, or model may share the same TCI 2312. TII 2314 allows differentiating individual tags within that class, make, or model from each other. The tag or the IC manufacturer may store TCI 2312 and TII 2314 on the tag at the time of IC manufacture or soon after.

The ISN 2320 may be at least subdivided into an item class identifier (ICI) 2322, which identifies the class of item to which the tag is attached and may be common to multiple items, and an item instance identifier (III) 2324 which may be null, unwritten, or invalid (as indicated by braces [ ] in FIG. 23) until serialized from TSN 2310. III 2324, once serialized as III 2326, is typically unique (at least for a period of time) and identifies an item in the class by its serialization. In some instances, for example ones in which tags with different ICIs are not mixed, ICI 2322 may be null. In other instances each item class may have a different ICI 2322, and all items of that class share the same ICI 2322. III 2326 allows differentiating particular items within that item class from each other. For example, ICI 2322 may identify an item class such as diapers and III 2326 may identify a particular box of diapers.

In some embodiments, ICI 2322 and III 2326 may be written at or around the time that the tag is associated with its host item. A system integrator or end-user may generate ISN 2320, store it on the tag, and apply the tag to its host item. Generating an ISN from scratch may involve a number-management system to generate, assign, and keep track of the assigned ISNs, particularly because each III should preferably be unique. Ensuring III uniqueness across multiple factories that manufacture the same type of item, and across multiple retailers when they need to replace a lost or damaged tag and generate a new III for an item, is a daunting task even if the uniqueness need be guaranteed only for a period of time, because that time period is typically measured in at least weeks, and more often months or years.

In a system according to embodiments, a tag may self-generate its III from its TSN. In some embodiments a tag may self-generate the III upon expiration of a timer, automatically upon IC power-up, in response to a reader command, automatically prior to backscattering the ISN to a reader, or upon a tag processing block performing an operation that uses the ISN. In some embodiments multiple tags can be instructed to simultaneously self-generate their ills. In some instances, if an III becomes corrupted then a reader can instruct a tag to regenerate the III from the TSN. In some instances a tag stores the self-generated III in NVM. In other instances the tag may store the self-generated III in volatile memory and generate it at power-up, upon reader command, or automatically prior to replying. In some instances the tag may not store the III at all and may instead self-generate it from the TSN every time it needs to use or send the III. Regardless of the method, because the tags themselves perform the serialization, the need for expensive ISN management systems is reduced.

In FIG. 23, a tag that has not yet been serialized is in state 0 (2302) in which TSN 2310 (comprising TCI 2312 and TII 2314) has been stored in the IC. However, the ISN 2320 is incomplete. In some embodiments, a tag in state 0 has ICI 2322 stored in the IC, but not III 2324 which may be null, unwritten, may contain an "unserialized" code, or may be in any other unprogrammed state as will be obvious to those skilled in the art. In some embodiments a tag also stores a state bit 2306 whose value indicates the tag state (i.e., whether the ISN has been serialized).

Upon a triggering event, which may be a reader command, a tag power-up, a timer expiration, a processing block 444 event, a request for or a need to backscatter an ISN, a need to calculate a cyclic redundancy check (CRC) over the ISN, a need to encrypt the ISN, receiving a signal from a reader, or any other event that requires the tag to possess a serialized ISN, a tag in state 0 transitions to state 1 (2304). In state 1, TSN 2310 and ICI 2322 remain unchanged relative to state 0, but the tag self-generates III 2326 by applying a function 2330 to at least a portion of TSN 2310. Function 2330 may be as simple as a direct copy (i.e., copy a portion of TSN 2310 into III 2326), an indexed copy (i.e. copy starting at a pointer location), or may include a complex algorithm for deriving or determining an III from TSN 2310. In some embodiments function 2330 may derive III 2326 from TI 2314. In other embodiments function 2330 may derive III 2326 from the entire TSN 2310. The self-serialization may also cause the tag to assert state bit 2306 to indicate that the tag's ISN has been serialized.

Figure 24:
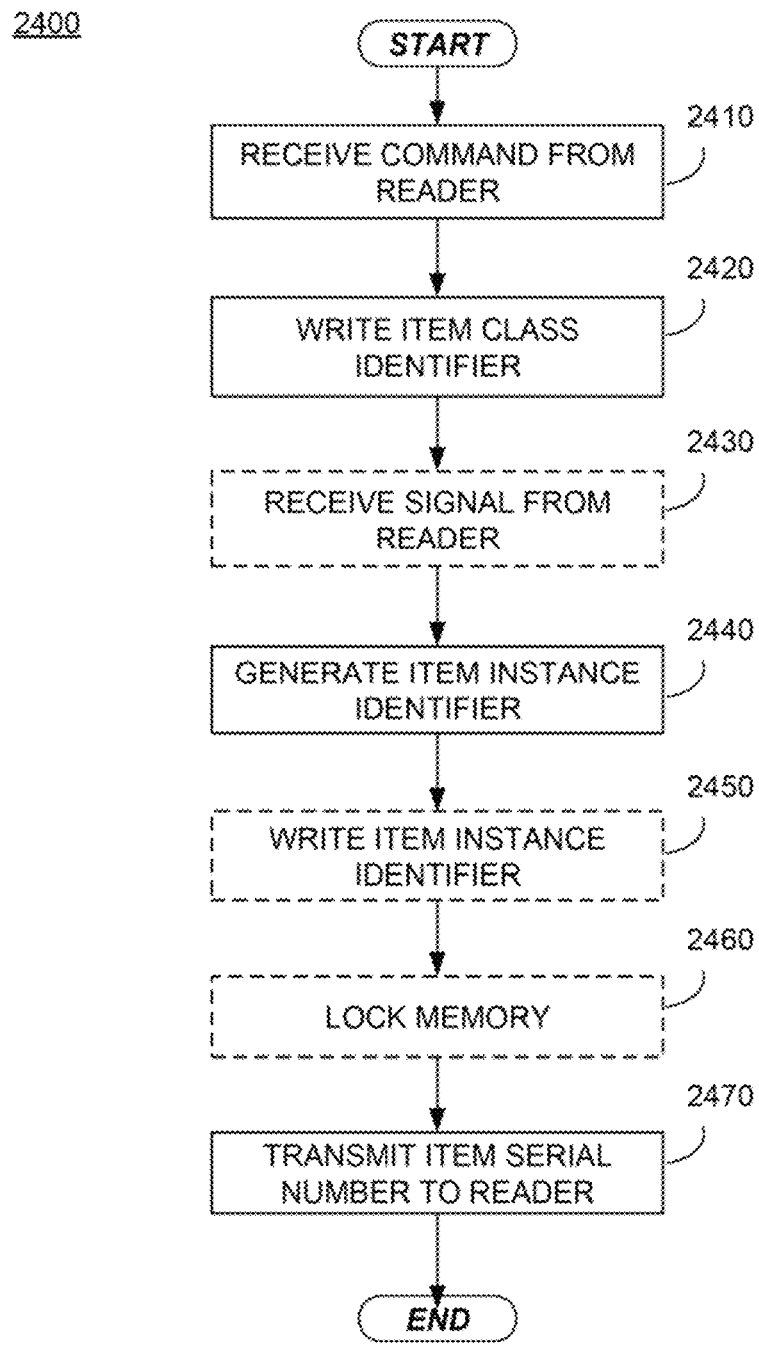
FIG. 24 is a flowchart of a tag IC self-serialization process according to embodiments.

FIG. 24 is a flowchart of a tag self-serialization process 2400 according to embodiments. In step 2410 an RFID tag receives a command containing at least a portion of an ICI. In response, at step 2420, the tag writes an ICI to tag memory. At step 2430 the tag optionally receives a signal, either from the same reader as in step 2410 or from a different reader. In some embodiments this signal may be a serialize command instructing the tag to self-generate and store an III. In other embodiments this signal may be an inventory command or a read command for which the tag generates an III with which to respond. In yet other embodiments this signal may be RF power, such as a CW wave, to which the tag IC powers-up and self-generates an III to use while the tag is powered. In yet other embodiments this signal may cause the tag to generate a new III different from a prior III, which may make tracking the tag difficult so as to protect consumer privacy.

In step 2440 the tag generates an III by applying an algorithm or function to at least a portion of a TSN already stored on the tag. The generation may be in response to the command in step 2410, the signal in step 2430, or in response to another trigger event altogether. The algorithm or function may be wholly or partially included in the command or signal, or may be already known to the tag IC. In optional step 2450 the tag writes the generated III to volatile or nonvolatile tag memory. This write step is optional because in some instances the tag may generate the III in step 2440, transmit it in step 2470 (see below), and then discard it.

In optional step 2460 the tag locks the memory containing the ICI, 111, or both, to prevent subsequent overwriting. Finally, in step 2470 the tag transmits the ISN containing the ICI and the self-generated III to a reader, either in response to the command in step 2410, the signal in step 2430, or responsive to another event altogether.

In some embodiments, a dual-sided IC may be configured to exhibit different behaviors or expose different memory portions in different situations, as described in U.S. Pat. No. 8,228,175 issued on Jul. 24, 2012, which has been incorporated by reference. FIG. 25 is a block diagram of components 2524 of an electrical circuit formed in an RFID IC according to embodiments. It will be recognized that some of components 2524 correspond to analogous components in circuit 424. Components 2524 include antenna contacts 2532, 2533, similar to antenna contacts 432, 433, for coupling to an antenna. Only two antenna contacts 2532, 2533 are shown, but more are possible, etc.

Components 2524 additionally include a memory 2550, analogous to memory 450. Memory 2550 may include a Memory Section A 2551, and a Memory Section B 2558. Memory Section A 2551 has a first set of memory bits, and Memory Section B 2558 has a second set of memory bits. It should be kept in mind that, in the embodiment of FIG. 25, Memory Section A 2551 is shown as wholly distinct from Memory Section B 2558, but that is only in the example of FIG. 25. While Memory Section A 2551 does not itself coincide exactly with Memory Section B 2558, the two could have portions that overlap, or one could be a subset of the other.

The first set of memory bits in Memory Section A 2551 stores Data A 2561, and the second set of memory bits in Memory Section B 2558 stores Data B 2568. Again, Data A 2561 is shown as wholly distinct from Data B 2568, but that is only in the example of FIG. 25. Some of Data A 2561 could be shared with Data B 2568, if any of the respective memory bits are shared. And, even if not shared, some of Data A 2561 could be identical with some of Data B 2568.

Components 2524 moreover include a processing block 2544 made according to embodiments. Processing block 2544 can be electrically coupled to the tag antenna via antenna contacts 2532, 2533. As such, processing block 2544 can receive via the antenna commands that have been issued by an RFID reader, and can operate in conformance with these commands, as specified according to a communication protocol. Such protocols have been described above. Some of these protocols define protocol states for the tag, and accordingly for processing block 2544.

Often such protocols require a tag to send a specific response to a first interrogator command, if the tag is in an internal tag protocol state that is compatible with a certain one of the called-for protocol states. In some embodiments, processing block 2544 can indeed be capable of being in an internal tag protocol state that is compatible with the certain called-for protocol state. In some embodiments, processing block 2544 can be capable of implementing the present invention with a single internal tag protocol state, which can be compatible by being a state that backscatters an ISN such as an EPC (such as an ISN in FIG. 23). In other embodiments, processing block 2544 can also be capable of attaining additional protocol states. Implementation-wise, if there are such additional protocol states, processing block 2544 can have a protocol state machine to point to which internal tag protocol state the processing block is in. Whereas microscopically, processing block 2544 can be in one or another internal tag protocol state, macroscopically it can be said that the RFID IC or the whole RFID tag is in this or that protocol state.

Often the protocol requires a tag receiving a first interrogator command to send a specific code in response, if the tag is in a state compatible with a certain one of the called-for protocol states. Processing block 2544, or its host tag, can start by being in such a compatible state, or it can start from a different state and then transition to the compatible state. Transitioning can be performed in any number of ways. In some embodiments, transitioning can happen in response to receiving one or more preliminary commands, etc. In fact, a number of protocols require such transitioning, and specify how it is to take place. Often this transitioning is performed as part of the tag becoming singulated from other tags.

If processing block 2544 is in a state compatible with the called-for protocol state, it may be able to send a reply code as the specific code, in response to the first command. Sending the reply code can be in conformance with the protocol. A protocol state has been called compatible for purposes of this document, in that the reply code is sent with such conformance, whether it is merely a compatible protocol state or the exact protocol state.

Processing block 2544 can additionally map either the first set of memory bits that are part of Memory Section A 2551 or, alternatively, the second set of memory bits that are part of Memory Section B 2558. If processing block 2544 maps the first set of memory bits in Memory Section A 2551, which stores the first data, then the reply code can be a first code that is derived at least in part from the mapped first data. Alternatively, if processing block 2544 maps the second set of bits in Memory Section B 2558, which stores the second data, then the reply code can be a second code. The second code, derived at least in part from the mapped second data, is often different from the first code.

It will be further understood that, while only two memory sections 2551, 2558 are shown among components 2524, the invention is not so limited. For example, there could a third memory section, with a third set of memory bits, for storing third data. A processing block according to some embodiments can map the third set of memory bits instead of the first or second, such that, if the processing block were to receive the first interrogator command while in a state compatible with a called-for protocol state, the reply code could be a third code derived at least in part from the third data, and different from the first code and the second code.

In general, an IC made according to embodiments optionally also includes a behavior indicator. If provided, the behavior indicator may indicate which of the first set and the second set of memory bits is being mapped by the processing block. In the example of FIG. 25, components 2524 additionally include an optional behavior indicator 2570. If provided, behavior indicator 2570 indicates either the first set of memory bits in Memory Section A 2551, or the second set of memory bits in Memory Section B 2558. Accordingly, behavior indicator 2570, if provided, further indicates either Data A 2561, or Data B 2568.

A behavior indicator is not required explicitly by the invention. In some embodiments, the behavior state is indicated instead by the context.

If provided, behavior indicator 2570 can be implemented in any number of ways. In some embodiments, but not necessarily all, the behavior indicator is encoded in one or more values stored in respective one or more memory cells of the IC. This situation is depicted in FIG. 25 by showing optional behavior indicator 2570 as straddling the boundary of tag memory 2550. If the behavior indicator is indeed encoded in one or more memory values then these values can even be values of the first data, the second data, etc.

FIG. 26 is a conceptual diagram 2600 illustrating how a tag can be in one of several different behavior states. Behavior state 2610 is a behavior state where the tag is easily readable. Behavior state 2682 is an obscured/privacy/scrambled behavior state, in that its code is scrambled, making it harder to read by an unauthorized reader. Behavior state 2684 is an obscured/privacy quiet behavior state, in that will respond only to a reader whose signal is strong enough. In this state 2684 the tag will respond when the reader is nearby, but not when the reader is farther away, even though in both cases the reader signal may convey sufficient power for the tag to respond. And a tag in behavior state 2686 replies with a scrambled code only to a reader whose signal is strong enough. In some embodiments a tag can even reply from behavior state 2610 when the tag is nearby the reader and receiving a strong signal, but can automatically transition to one of behavior states 2682, 2684, 2686 when the tag is far from the reader and receiving a weak signal.

Figure 27:
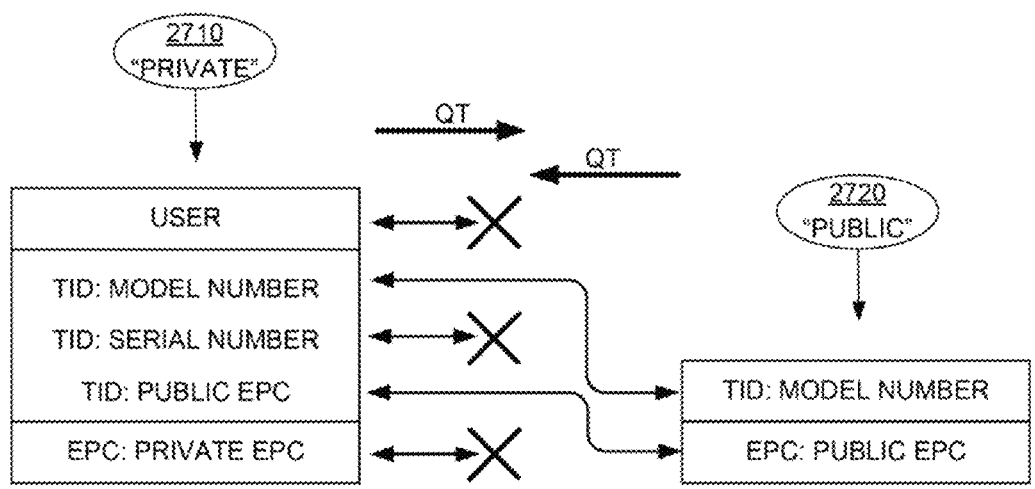
FIG. 27 illustrates switching the exposed tag memory from private to public states, and vice versa.

In some embodiments, a dual-sided IC may be configured to transition between a private profile and a public profile. FIG. 27 illustrates switching the exposed tag memory from private to public, and vice versa, according to embodiments.

Diagram 2700 shows the transition between private profile 2710 and public profile 2720, where different portions of tag memory are hidden from or visible to a reader. In the private profile the tag exposes user memory; TID memory containing a tag model number, tag serial number, and a public EPC; and EPC memory containing a private EPC. In some applications a reader writes a value into a public EPC memory location and then "publicizes" the tag using a QT command. Readers are free to encode as little or as much information into the public EPC field as they choose (including no information at all) before publicizing the tag.

One usage model for private and public profiles includes a tag containing a private EPC in private EPC memory that indicates the item to which the tag is attached. At point-of-sale a reader may write sale information, such as a store code or a sale code, into the public EPC location located in TID memory, then issue a QT command to switch the tag's exposed memory profile from private to public. Once switched, the tag conceals its user memory, TID serial number, and private EPC. Instead the tag exposes its public EPC in public EPC memory, remapped from the prior location in TID memory. During inventory, the tag will now send this public EPC to a reader, which may contain the sale code but typically not the EPC of the item to which the tag is attached. Notice that in this example the tag's public memory is a subset of the tag's private memory—the tag remaps its model number and public EPC, from the private-state TID memory bank to a model number and public EPC located in the public-state TID and public-state EPC memory banks, respectively. Of course, the public memory need not be a subset of the private memory, but could be totally different, as could the choice of memory locations to transfer from private state to public. Finally, in some embodiments the state switching is reversible, allowing the reader to instruct the tag to switch from exposing its private memory back again to exposing its public memory.

Figure 28:
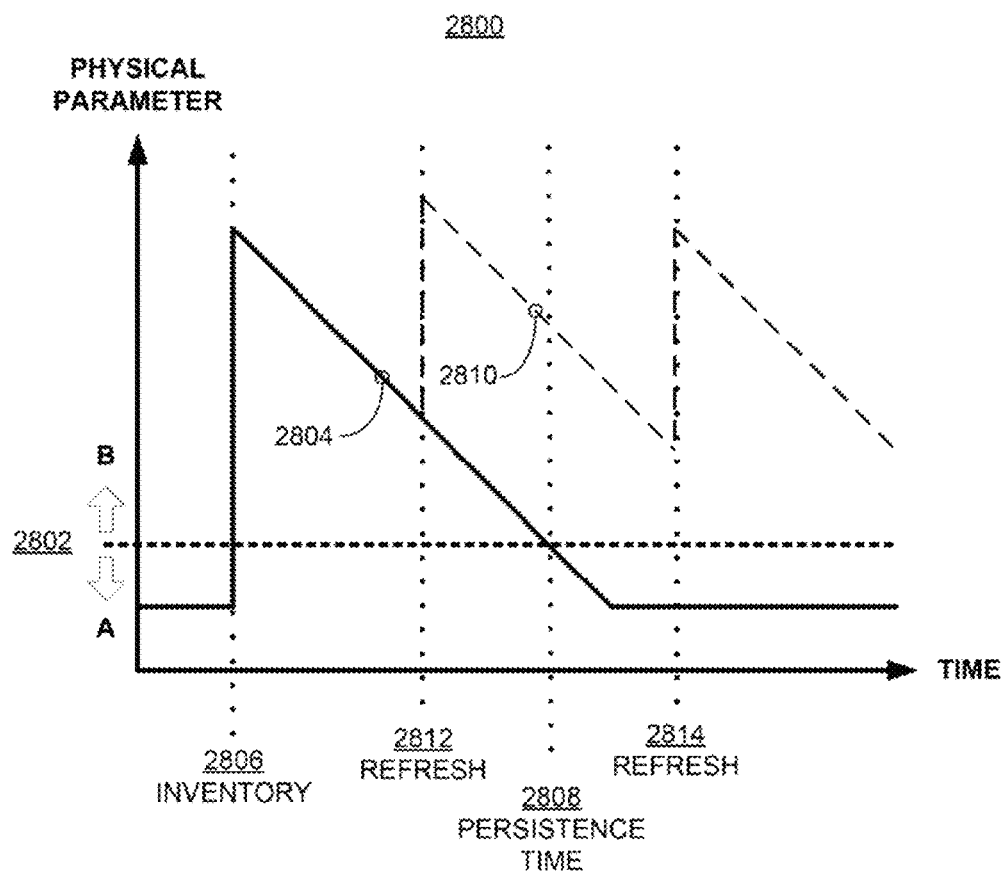
FIG. 28 is a diagram showing the effects of a broadcast refresh on tag flag physical parameters as a function of time, according to embodiments.

In some embodiments, a dual-sided IC may be configured to perform a tag-flag refresh. FIG. 28 is a diagram 2800 showing the effects of a refresh on a tag-flag physical parameter as a function of time, according to embodiments. A tag-flag physical parameter may include one or more of voltage, current, charge, and flux. In some embodiments, if the value of a flag physical parameter is above a threshold 2802 then the flag is considered to hold a first value (for example, the value "B"), whereas if the value of the flag physical parameter is below the threshold 2802 then the flag is considered to hold a second value (e.g., the value "A"). When a tag is subject to an inventory operation 2806 then the tag-flag physical parameter may be adjusted so as to switch the flag's value. Although the inventory operation 2806 in FIG. 28 asserts the tag flag value from "A" to "B", in other embodiments an inventory operation may assert the tag flag value from "B" to "A". The amount by which the tag-flag physical parameter is adjusted by an inventory operation may be static (e.g., it is always increased/decreased by a preset amount) or dynamic (e.g., the amount of increase/decrease varies according to any number of parameters), as long as the adjustment amount is sufficient to change the flag value.

After the inventory operation 2806, the tag-flag physical parameter will decay over time, as indicated by curve 2804. At some time 2808 the tag-flag physical parameter will decay below threshold 2802, switching the flag value from B back to A. The difference between time 2808 and time 2806 is the flag's persistence time, and is how long the flag holds the value B. The rate at which the physical parameter decays may be a function of one or more tag and/or environmental conditions, such as tag design or temperature.

If the tag is capable of executing a tag-flag refresh, and a reader sends a refresh command 2812 such that the tag receives it before time 2808 (and therefore before the physical parameter has decayed below threshold 2802), then the refresh command 2812 adjusts (or instructs the tag to adjust) the physical parameter to increase the persistence time of the asserted flag value (in the example of FIG. 28 the asserted value is "B"). In some embodiments the refresh command 2812 is a broadcast command, where the term "broadcast" as used in this document implies that the command is directed to a plurality of tags rather than to a singulated tag (where "singulated" is defined as an individual tag singled-out by a reader from among the plurality of tags). As above, the adjustment amount may be static or dynamic, as long as the post-refresh parameter value is different from the parameter value before the refresh command. By broadcasting successive refresh commands (e.g., refresh command 2814) the resulting decay curve 2810 can be adjusted such that the effective flag persistence time (i.e., the time at which the curve 2810 drops below the threshold 2802) can be extended as far beyond the normal flag persistence time as desired.

According to some embodiments, an RFID IC may include a first circuit block electrically coupled to first and second antenna contacts. The first antenna contact may be disposed on a first surface of the IC and the second antenna contact may be disposed on a second surface of the IC different from the first surface. The first and second antenna contacts may be electrically disconnected from each other.

In some embodiments, the first circuit block may include a rectifier or charge pump, a modulator, a demodulator, a power management unit, an impedance-matching circuit, and/or a tuning circuit. The first circuit block may be configured to generate an RF response using half-duplex communications. If the first circuit block includes a modulator then the modulator may be configured to electrically connect and disconnect the first and second antenna contacts so as to generate an RF reply signal. In some embodiments a reader illuminates the RFID tag with a continuous (i.e. unmodulated) RF wave; the tag modulator connecting and disconnecting its antenna contacts changes the antenna reflectance and thereby generates a backscattered RF reply signal. The modulator may electrically couple to one of the antenna contacts through an electrically-conductive substrate, by means of a through-IC via, and/or by means of a side contact.

In some embodiments at least one of the first antenna contact and the second antenna contact includes at least one conductive pad spanning substantially the entire respective surface of the IC. In some embodiments at least a portion of the first antenna contact and the second antenna contact is suitable for coupling to an antenna terminal. In some embodiments the first and second antenna contacts couple to the first circuit block. In some embodiments the coupling between at least one of the antenna contacts and the first circuit block is through a substrate of the IC, a through-IC via, and/or a side contact. In some embodiments the coupling between the first and/or second antenna contacts and its respective antenna terminal may be galvanic or capacitive. If the coupling is galvanic then the first antenna contact may include a conductive metallic (e.g., including aluminum, copper, gold, or any other suitable metal) or semimetallic (e.g., including one or more semi-metals) layer annealed to or deposited on the substrate. The through-IC via may be electrically connected to or electrically disconnected from the substrate. The side contact may be deposited on a third surface of the IC different from the first and second surfaces. The first circuit block and the first antenna contact may be electrically connected to each other by a through-IC via and the first antenna contact as well as the through-IC via may be electrically disconnected from the substrate.

In some embodiments the IC may include a memory for storing a first code and a second code, and the first circuit block may include a processing block operable to cause the first code to be backscattered if a first command is received from an RFID reader, receive a second command, and cause to be backscattered responsive to receiving the second command a combination made from at least portions of the first code and the second code, without receiving any commands while the combination is being backscattered. The first circuit block may be configured to extract power with a first efficiency from an RF wave incident on an antenna and begin operating according to a protocol when the extracted power exceeds a first value, and may include a variable impedance element electrically coupled to the first and second antenna contacts and a tuning circuit configured to begin operating when the extracted power exceeds a second value less than the first value and adjust the variable impedance element to enable the first circuit block to extract power from the RF wave with a second efficiency greater than the first efficiency.

In other embodiments the IC may include at least one capacitor coupling at least one of the first and second antenna contacts to an antenna terminal. In some embodiments the at least one capacitor contains a dielectric material including at least one of a covering layer of the IC and a covering layer of the antenna. The first circuit block may include a processing block configured to receive a refresh signal and refresh an inventoried flag in response to receiving the refresh signal.

According to other examples, a method for manufacturing an RFID IC may include forming a first antenna contact on a first surface of the IC, forming a second antenna contact on a second, different surface of the IC, and coupling a first circuit block in the IC to the first antenna contact and the second antenna contact, where the first and second antenna contacts are electrically disconnected from each other.

In some embodiments, the first circuit block may include a modulator, and the method may include coupling the modulator to the first antenna contact through a conductive substrate so as to enable the modulator to generate an RF signal by electrically connecting and disconnecting the first and second antenna contacts.

In some embodiments the method may include annealing a conductive layer to or depositing a conductive layer on the substrate. The method may include electrically connecting a through-IC via to, or disconnecting a though-IC via from, the substrate. The method may include annealing or depositing a side contact on a third surface of the IC different from the first and second surfaces, and/or electro-plating the first antenna contact, second antenna contact, and side contact on their respective surfaces.

According to further examples, a method for generating a radio-frequency (RF) signal with an RFID IC having a first antenna contact disposed on a first surface and a second antenna contact disposed on a different surface may include providing data to be encoded into the RF signal and electrically connecting and disconnecting the first and second antenna contacts through a conductive substrate so as to generate the RF signal.

According to some examples, an RFID tag may include an RFID IC with a first antenna terminal disposed on a first side and a second antenna terminal disposed on a second side different from the first, a first tag portion including a first antenna section electrically coupled to the first antenna terminal, and a second tag portion including a second antenna section electrically coupled to the second antenna terminal.

According to other examples, an RFID strap may include a nonconductive layer, a conductive layer disposed on a surface of the nonconductive layer, and an RFID IC with a first antenna terminal disposed on a first side and a second antenna terminal disposed on a second side different from the first side. The first antenna terminal may be affixed and electrically coupled to the conductive layer, and the conductive layer and the second antenna terminal may form an antenna port configured to couple with an RFID antenna.

The above specification, examples, and data provide a complete description of the composition, manufacture, and use of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

We claim:

1. A Radio Frequency identification (RFID) integrated circuit (IC) comprising:
   an IC substrate;
   a first antenna contact disposed on a first surface of the IC substrate;
   a second antenna contact electrically disconnected from the first antenna contact and disposed on a second surface of the IC substrate different from the first surface;
   a circuit block disposed in the IC substrate, the circuit block electrically coupled to the first antenna contact and the second antenna contact; and
   an electrically conductive substrate disposed in the IC substrate and electrically coupling the circuit block to at least one of the first antenna contact and the second antenna contact.

2. The RFID IC of claim 1, wherein the circuit block includes a modulator electrically coupled to at last one of the first antenna contact and the second antenna contact through the electrically conductive substrate and configured to generate an RF response by alternately electrically connecting and disconnecting the first and second antenna contacts.

3. The RFID IC of claim 1, wherein the circuit block includes a charge pump electrically coupled to at least one of the first antenna contact and the second antenna contact through the electrically conductive substrate such that a current flow is from the first antenna contact to the second antenna contact through the electrically conductive substrate during a first phase of an incident RF signal and is from the second antenna contact to the first antenna contact though the electrically conductive substrate during a second phase of the incident RF signal.

4. The RFID IC of claim 1, wherein at least one of the first antenna contact and the second antenna contact includes at least one conductive pad spanning an entire surface of the IC substrate.

5. The RFID IC of claim 1, wherein the circuit block and the first antenna contact are electrically connected to each other through the electrically conductive substrate and the first antenna contact is electrically disconnected from the IC substrate.

6. The RFID IC of claim 1, wherein:
   the circuit block is capable of tuning a variable impedance element electrically coupled to the first and second antenna contacts; and
   the circuit block is configured to:
      extract, before tuning the variable impedance element, a first power that is less than a sufficient power to operate the IC from an RF wave incident on an antenna;
      tune the variable impedance element to increase power extraction;
      extract, after tuning the variable impedance element, a second power equal to or grater than the sufficient power to overate the IC; and
      provide the extracted second power to the IC for operation according to the protocol.

7. The RFID IC of claim 1, further comprising:
   at least one capacitor between at least one of the first and second antenna contacts and an antenna and containing a dielectric material, wherein the dielectric material includes at least one of a covering layer of the IC substrate and a covering layer of the antenna.

8. The RFID IC of claim 1, further including a nonconductive stabilization layer, wherein:
   the first antenna contact is disposed on a surface of the stabilization layer, and
   the circuit block is electrically coupled to the first antenna contact through an opening in the stabilization layer.

9. A Radio Frequency Identification (RFID) tag comprising:
   an antenna having a first antenna terminal and a second antenna terminal;
   a first tag substrate portion;
   a dual-sided integrated circuit (IC) including a circuit block electrically coupled to a first antenna contact and to a second antenna contact; and
   a variable impedance element electrically coupled to the first and second antenna contacts, wherein:
   the first antenna contact is disposed on a first external surface of the IC,
   the second antenna contact is disposed on a second external surface of the IC different from the first external surface of the IC,
   the first and second antenna contacts are electrically disconnected from each other,
   the electrical coupling of the circuit block to one of the first and second antenna contacts is through an electrically conductive substrate of the IC,
   the IC is disposed on the first tag substrate portion,
   an electrical connection is formed between the first antenna contact and the first antenna terminal, and
   the circuit block is configured to:
      extract, before tuning the variable impedance element, a first power less than a sufficient power to operate the IC from an RF wave incident on an antenna;
      tune the variable impedance element to increase power extraction;
      extract, after tuning the variable impedance element, a second power equal to or greater than the sufficient power to operate the IC; and
      provide the extracted second power to the IC for operation according to the protocol.

10. The RFID tag of claim 9, wherein:
    the first and second antenna terminals are disposed on the first tag substrate portion; and
    a second tag substrate portion includes an electrical bridge configured to form an electrical connection between the second antenna contact and the second antenna terminal.

11. The RFID tag of claim 9, wherein the second antenna terminal is deposed on a second tag substrate portion.

12. The RFID tag of claim 9, wherein the first tag substrate portion includes at least one of a dimple, a through-substrate hole, and a slot, configured to at least partially contain the IC.

13. The RFID tag of claim 9, wherein the IC further comprises:
    a memory for storing a first code and a second code, and
    a processing block operable to:
       transmit the first code if a first command is received;
       receive a second command; and
       transmit, responsive to receiving the second command, a combination nude from at least portions of the first code and the second code, without receiving any commands while the combination being transmitted.

14. The RFID tag of claim 9, wherein the IC further comprises a processing block configured to:
    receive a refresh signal; and
    in response to receiving the refresh signal, refresh an inventoried flag.

* * * * *